(12) United States Patent
Malet et al.

(10) Patent No.: US 8,784,937 B2
(45) Date of Patent: Jul. 22, 2014

(54) GLASS SUBSTRATES HAVING CARBON NANOTUBES GROWN THEREON AND METHODS FOR PRODUCTION THEREOF

(75) Inventors: Brandon K. Malet, Baltimore, MD (US); Tushar K. Shah, Fulton, MD (US)

(73) Assignee: Applied NanoStructured Solutions, LLC, Baltimore, MD (US)

( * ) Notice: Subject to any disclaimer, the term of this patent is extended or adjusted under 35 U.S.C. 154(b) by 346 days.

(21) Appl. No.: 13/230,751

(22) Filed: Sep. 12, 2011

(65) Prior Publication Data

US 2012/0064332 A1 Mar. 15, 2012

Related U.S. Application Data

(60) Provisional application No. 61/382,861, filed on Sep. 14, 2010.

(51) Int. Cl.

| | |
|---|---|
| *C23C 16/00* | (2006.01) |
| *C01B 31/02* | (2006.01) |
| *D01F 9/127* | (2006.01) |
| *C03C 25/10* | (2006.01) |
| *C03C 25/22* | (2006.01) |
| *C03C 25/44* | (2006.01) |
| *B82Y 30/00* | (2011.01) |
| *C23C 16/26* | (2006.01) |
| *C23C 16/458* | (2006.01) |
| *C23C 16/54* | (2006.01) |
| *B05D 3/10* | (2006.01) |

(52) U.S. Cl.
CPC .......... *C01B 31/0233* (2013.01); *C01B 31/024* (2013.01); *D01F 9/127* (2013.01); *C03C 25/1095* (2013.01); *C03C 25/223* (2013.01); *C03C 25/44* (2013.01); *B82Y 30/00* (2013.01); *C23C 16/26* (2013.01); *C23C 16/458* (2013.01); *C23C 16/545* (2013.01); *B05D 3/10* (2013.01); *B05D 2203/35* (2013.01); *B05D 2256/00* (2013.01); *Y10S 977/843* (2013.01); *Y10S 977/891* (2013.01)
USPC .................. 427/249.3; 427/249.1; 427/255.5; 427/301; 977/843; 977/891

(58) Field of Classification Search
USPC ..................................................... 427/249.1
See application file for complete search history.

(56) References Cited

U.S. PATENT DOCUMENTS

| | | |
|---|---|---|
| 4,300,821 A | 11/1981 | Mignen |
| 4,515,107 A | 5/1985 | Fournier et al. |
| 4,530,750 A | 7/1985 | Aisenberg et al. |
| 4,707,349 A | 11/1987 | Hjersted |
| 4,797,378 A | 1/1989 | Sowman |
| 4,920,917 A | 5/1990 | Nakatani et al. |
| 5,093,155 A | 3/1992 | Miyazaki et al. |
| 5,130,194 A | 7/1992 | Baker et al. |
| 5,173,367 A | 12/1992 | Liimatta et al. |
| 5,221,605 A | 6/1993 | Bard et al. |
| 5,225,659 A | 7/1993 | Kusano et al. |
| 5,238,808 A | 8/1993 | Bard et al. |
| 5,246,794 A | 9/1993 | Blomgren et al. |
| 5,310,687 A | 5/1994 | Bard et al. |
| 5,470,408 A | 11/1995 | Nielson et al. |
| 5,514,217 A | 5/1996 | Niino et al. |
| 5,547,525 A | 8/1996 | Bennett et al. |
| 5,571,749 A | 11/1996 | Matsuda et al. |
| 5,595,750 A | 1/1997 | Jacobson et al. |
| 5,639,984 A | 6/1997 | Nielson |
| 5,714,089 A | 2/1998 | Bard et al. |
| 5,731,147 A | 3/1998 | Bard et al. |
| 5,764,004 A | 6/1998 | Rabinowitz |
| 5,780,101 A | 7/1998 | Nolan et al. |
| 5,908,585 A | 6/1999 | Shibuta |
| 5,968,274 A | 10/1999 | Fujioka et al. |
| 5,997,832 A | 12/1999 | Lieber et al. |
| 6,072,930 A | 6/2000 | Kornreich et al. |
| 6,140,138 A | 10/2000 | Bard et al. |

(Continued)

FOREIGN PATENT DOCUMENTS

| | | |
|---|---|---|
| CA | 2476881 A1 | 9/2003 |
| CN | 1345694 | 4/2002 |

(Continued)

OTHER PUBLICATIONS

Medalia et al. Redox Recipes. I. Reaction between Ferrous Iron and Peroxides. General Considerations. Journal of Poly. Sci. vol. IV, pp. 377-398, 1949.*

(Continued)

*Primary Examiner* — David Turocy
(74) *Attorney, Agent, or Firm* — McDermott, Will & Emery LLP (57) ABSTRACT

Methods for growing carbon nanotubes on glass substrates, particularly glass fiber substrates, are described herein. The methods can include depositing a catalytic material or a catalyst precursor on a glass substrate; depositing a non-catalytic material on the glass substrate prior to, after, or concurrently with the catalytic material or catalyst precursor; and exposing the glass substrate to carbon nanotube growth conditions so as to grow carbon nanotubes thereon. The glass substrate, particularly a glass fiber substrate, can be transported while the carbon nanotubes are being grown thereon. Catalyst precursors can be converted into a catalyst when exposed to carbon nanotube growth conditions. The catalytic material or catalyst precursor and the non-catalytic material can be deposited from a solution containing water as a solvent. Illustrative deposition techniques include, for example, spray coating and dip coating.

15 Claims, 4 Drawing Sheets

(56) References Cited

U.S. PATENT DOCUMENTS

| | | |
|---|---|---|
| 6,146,462 A | 11/2000 | Yializis et al. |
| 6,146,642 A | 11/2000 | Garcia-Sastre et al. |
| 6,184,280 B1 | 2/2001 | Shibuta |
| 6,221,154 B1 | 4/2001 | Lee et al. |
| 6,232,706 B1 | 5/2001 | Dai et al. |
| 6,251,520 B1 | 6/2001 | Blizzard et al. |
| 6,270,897 B1 | 8/2001 | Flautt et al. |
| 6,331,209 B1 | 12/2001 | Jang et al. |
| 6,333,016 B1 | 12/2001 | Resasco et al. |
| 6,361,861 B2 | 3/2002 | Gao et al. |
| 6,413,487 B1 | 7/2002 | Resasco et al. |
| 6,420,293 B1 | 7/2002 | Chang et al. |
| 6,440,277 B1 | 8/2002 | D'Amato |
| 6,455,021 B1 | 9/2002 | Saito |
| 6,465,057 B1 | 10/2002 | Nakahigashi et al. |
| 6,479,028 B1 | 11/2002 | Kaner et al. |
| 6,491,789 B2 | 12/2002 | Niu |
| 6,495,258 B1 | 12/2002 | Chen et al. |
| 6,528,572 B1 | 3/2003 | Patel et al. |
| 6,564,744 B2 | 5/2003 | Nakahigashi et al. |
| 6,653,619 B2 | 11/2003 | Chin et al. |
| 6,673,392 B2 | 1/2004 | Lee et al. |
| 6,692,717 B1 | 2/2004 | Smalley et al. |
| 6,765,949 B2 | 7/2004 | Chang |
| 6,790,425 B1 | 9/2004 | Smalley et al. |
| 6,818,821 B2 | 11/2004 | Fujieda et al. |
| 6,837,928 B1 | 1/2005 | Zhang et al. |
| 6,852,410 B2 | 2/2005 | Veedu et al. |
| 6,863,942 B2 | 3/2005 | Ren et al. |
| 6,887,451 B2 | 5/2005 | Dodelet et al. |
| 6,900,264 B2 | 5/2005 | Kumar et al. |
| 6,900,580 B2 | 5/2005 | Dai et al. |
| 6,908,572 B1 | 6/2005 | Derbyshire et al. |
| 6,913,075 B1 | 7/2005 | Knowles et al. |
| 6,934,600 B2 | 8/2005 | Jang et al. |
| 6,936,653 B2 | 8/2005 | McElrath et al. |
| 6,955,800 B2 | 10/2005 | Resasco et al. |
| 6,962,892 B2 | 11/2005 | Resasco et al. |
| 6,967,013 B2 | 11/2005 | Someya et al. |
| 6,979,709 B2 | 12/2005 | Smalley et al. |
| 6,986,853 B2 | 1/2006 | Glatkowski et al. |
| 6,986,877 B2 | 1/2006 | Takikawa et al. |
| 6,994,907 B2 | 2/2006 | Resasco et al. |
| 7,011,760 B2 | 3/2006 | Wang et al. |
| 7,018,600 B2 | 3/2006 | Yanagisawa et al. |
| 7,022,776 B2 | 4/2006 | Bastiaens et al. |
| 7,045,108 B2 | 5/2006 | Jiang et al. |
| 7,056,452 B2 | 6/2006 | Niu et al. |
| 7,074,294 B2 | 7/2006 | Dubrow |
| 7,094,386 B2 | 8/2006 | Resasco et al. |
| 7,105,596 B2 | 9/2006 | Smalley et al. |
| 7,108,841 B2 | 9/2006 | Smalley et al. |
| 7,118,693 B2 | 10/2006 | Glatkowski et al. |
| 7,125,533 B2 * | 10/2006 | Khabashesku et al. .... 423/447.1 |
| 7,125,534 B1 | 10/2006 | Smalley et al. |
| 7,132,621 B2 | 11/2006 | Kumar et al. |
| 7,144,563 B2 | 12/2006 | Rao et al. |
| 7,148,619 B2 | 12/2006 | Den et al. |
| 7,151,129 B2 | 12/2006 | Ishikawa et al. |
| 7,153,452 B2 | 12/2006 | Ogale et al. |
| 7,157,068 B2 | 1/2007 | Li et al. |
| 7,160,531 B1 | 1/2007 | Jacques et al. |
| 7,160,532 B2 * | 1/2007 | Liu et al. ................ 423/447.3 |
| 7,211,320 B1 | 5/2007 | Cooper et |
| 7,226,643 B2 | 6/2007 | Juang et al. |
| 7,235,159 B2 | 6/2007 | Gu et al. |
| 7,239,073 B2 | 7/2007 | Takikawa et al. |
| 7,253,442 B2 | 8/2007 | Huang et al. |
| 7,261,779 B2 | 8/2007 | Gardner |
| 7,265,174 B2 | 9/2007 | Carroll et al. |
| 7,265,175 B2 | 9/2007 | Winey et al. |
| 7,278,324 B2 | 10/2007 | Smits et al. |
| 7,294,302 B2 | 11/2007 | Koide et al. |
| 7,329,698 B2 | 2/2008 | Noguchi et al. |
| 7,338,684 B1 | 3/2008 | Curliss et al. |
| 7,354,881 B2 | 4/2008 | Resasco et al. |
| 7,354,988 B2 | 4/2008 | Charati et al. |
| 7,372,880 B2 | 5/2008 | Jablonski et al. |
| 7,384,663 B2 | 6/2008 | Olry et al. |
| 7,399,794 B2 | 7/2008 | Harmon et al. |
| 7,407,640 B2 | 8/2008 | Barrera et al. |
| 7,407,901 B2 | 8/2008 | Bystricky et al. |
| 7,410,628 B2 | 8/2008 | Bening et al. |
| 7,419,601 B2 | 9/2008 | Cooper et al. |
| 7,431,965 B2 | 10/2008 | Grigorian et al. |
| 7,445,817 B2 | 11/2008 | Kumar et al. |
| 7,448,441 B2 | 11/2008 | Hendricks et al. |
| 7,448,931 B2 | 11/2008 | Liu et al. |
| 7,459,627 B2 | 12/2008 | Lee et al. |
| 7,465,605 B2 | 12/2008 | Raravikar et al. |
| 7,473,466 B1 | 1/2009 | Muradov |
| 7,479,052 B2 | 1/2009 | Kim et al. |
| 7,488,455 B2 | 2/2009 | Dai et al. |
| 7,494,639 B2 * | 2/2009 | Dean et al. ................ 423/461 |
| 7,504,078 B1 | 3/2009 | Jacques et al. |
| 7,510,695 B2 | 3/2009 | Smalley et al. |
| 7,534,486 B2 | 5/2009 | Boerstoel et al. |
| 7,563,411 B2 | 7/2009 | Jiang et al. |
| 7,563,428 B2 | 7/2009 | Resasco et al. |
| 7,569,425 B2 | 8/2009 | Huang et al. |
| 7,588,700 B2 | 9/2009 | Kwon et al. |
| 7,592,248 B2 | 9/2009 | Ventzek et al. |
| 7,597,869 B2 | 10/2009 | Hsiao |
| 7,608,798 B2 | 10/2009 | Kumar et al. |
| 7,611,579 B2 | 11/2009 | Lashmore et al. |
| 7,615,204 B2 | 11/2009 | Ajayan et al. |
| 7,615,205 B2 | 11/2009 | Jiang et al. |
| 7,632,550 B2 | 12/2009 | Mizuno et al. |
| 7,632,569 B2 | 12/2009 | Smalley et al. |
| 7,656,027 B2 | 2/2010 | Dangelo et al. |
| 7,666,915 B2 * | 2/2010 | Zhang et al. ................ 516/32 |
| 7,687,981 B2 | 3/2010 | Parsapour |
| 7,700,943 B2 | 4/2010 | Raravikar et al. |
| 7,709,087 B2 | 5/2010 | Majidi et al. |
| 7,718,220 B2 | 5/2010 | D'Silva et al. |
| 7,771,798 B1 | 8/2010 | Grosse et al. |
| 7,776,777 B2 | 8/2010 | Kim et al. |
| 7,811,632 B2 | 10/2010 | Eres |
| 7,815,820 B2 | 10/2010 | Tan et al. |
| 7,816,709 B2 | 10/2010 | Balzano et al. |
| 7,862,795 B2 | 1/2011 | Zhang et al. |
| 7,867,468 B1 | 1/2011 | Haddon et al. |
| 7,871,591 B2 | 1/2011 | Harutyunyan et al. |
| 7,880,376 B2 | 2/2011 | Takai et al. |
| 7,927,701 B2 | 4/2011 | Curliss et al. |
| 8,148,276 B2 | 4/2012 | Nejhad et al. |
| 8,168,291 B2 | 5/2012 | Shah et al. |
| 2002/0035170 A1 | 3/2002 | Glatkowski et al. |
| 2002/0085968 A1 | 7/2002 | Smalley et al. |
| 2002/0102201 A1 | 8/2002 | Colbert et al. |
| 2002/0197474 A1 | 12/2002 | Reynolds |
| 2003/0042147 A1 * | 3/2003 | Talin et al. ................ 205/238 |
| 2003/0068432 A1 | 4/2003 | Dai et al. |
| 2003/0102585 A1 | 6/2003 | Poulin et al. |
| 2003/0111333 A1 | 6/2003 | Montgomery et al. |
| 2003/0175003 A1 | 9/2003 | Gasca et al. |
| 2004/0007955 A1 | 1/2004 | Yaniv et al. |
| 2004/0026234 A1 | 2/2004 | Vanden Brande et al. |
| 2004/0079278 A1 | 4/2004 | Kamins et al. |
| 2004/0082247 A1 | 4/2004 | Desai et al. |
| 2004/0089237 A1 | 5/2004 | Pruett et al. |
| 2004/0105807 A1 | 6/2004 | Fan et al. |
| 2004/0245088 A1 | 12/2004 | Gardner |
| 2004/0247808 A1 | 12/2004 | Cooper et al. |
| 2004/0253167 A1 | 12/2004 | Silva et al. |
| 2005/0009694 A1 | 1/2005 | Watts et al. |
| 2005/0026778 A1 | 2/2005 | Axtell et al. |
| 2005/0090176 A1 * | 4/2005 | Dean et al. ................ 445/51 |
| 2005/0093458 A1 | 5/2005 | Babayan et al. |
| 2005/0100501 A1 | 5/2005 | Veedu et al. |
| 2005/0112052 A1 | 5/2005 | Gu et al. |
| 2005/0119105 A1 | 6/2005 | Zimmer et al. |
| 2005/0119371 A1 | 6/2005 | Drzal et al. |
| 2005/0147553 A1 * | 7/2005 | Wong et al. ................ 423/447.2 |

(56) References Cited

U.S. PATENT DOCUMENTS

| | | |
|---|---|---|
| 2005/0164169 A1 | 7/2005 | Malak |
| 2005/0170089 A1 | 8/2005 | Lashmore et al. |
| 2005/0172370 A1 | 8/2005 | Haq et al. |
| 2005/0176329 A1* | 8/2005 | Olry et al. ............ 442/388 |
| 2005/0188727 A1 | 9/2005 | Greywall |
| 2005/0191490 A1 | 9/2005 | Ton-That et al. |
| 2005/0215164 A1 | 9/2005 | Mueller et al. |
| 2005/0245622 A1 | 11/2005 | Beijense et al. |
| 2005/0260412 A1 | 11/2005 | Gardner |
| 2005/0263456 A1 | 12/2005 | Cooper et al. |
| 2005/0287064 A1 | 12/2005 | Mayne et al. |
| 2006/0002844 A1 | 1/2006 | Suenaga et al. |
| 2006/0052509 A1 | 3/2006 | Saitoh |
| 2006/0062944 A1 | 3/2006 | Gardner et al. |
| 2006/0067871 A1 | 3/2006 | Hart et al. |
| 2006/0083674 A1* | 4/2006 | Maruyama et al. ........ 423/447.3 |
| 2006/0083927 A1 | 4/2006 | Von Ehr |
| 2006/0104890 A1* | 5/2006 | Harutyunyan et al. .... 423/447.3 |
| 2006/0110599 A1 | 5/2006 | Honma et al. |
| 2006/0121275 A1 | 6/2006 | Poulin et al. |
| 2006/0159916 A1 | 7/2006 | Dubrow et al. |
| 2006/0165914 A1 | 7/2006 | Abrahamson |
| 2006/0172179 A1 | 8/2006 | Gu et al. |
| 2006/0177602 A1 | 8/2006 | Dijon et al. |
| 2006/0198956 A1 | 9/2006 | Eres |
| 2006/0205304 A1 | 9/2006 | Marzolin et al. |
| 2007/0009421 A1 | 1/2007 | Kittrell et al. |
| 2007/0020167 A1 | 1/2007 | Han et al. |
| 2007/0035226 A1 | 2/2007 | Ganapathiraman et al. |
| 2007/0048521 A1 | 3/2007 | Istvan |
| 2007/0053824 A1 | 3/2007 | Subramanya et al. |
| 2007/0054105 A1 | 3/2007 | Hsiao |
| 2007/0090489 A1 | 4/2007 | Hart et al. |
| 2007/0092431 A1 | 4/2007 | Resasco et al. |
| 2007/0103048 A1 | 5/2007 | Liu et al. |
| 2007/0110977 A1 | 5/2007 | Al-Haik et al. |
| 2007/0128960 A1 | 6/2007 | Ghasemi Nejhad et al. |
| 2007/0135588 A1 | 6/2007 | Diakoumakos et al. |
| 2007/0141114 A1 | 6/2007 | Muisener et al. |
| 2007/0148340 A1 | 6/2007 | Kalkanoglu et al. |
| 2007/0148429 A1 | 6/2007 | McGrath et al. |
| 2007/0183959 A1 | 8/2007 | Charlier et al. |
| 2007/0189953 A1 | 8/2007 | Bai et al. |
| 2007/0205394 A1 | 9/2007 | Furman et al. |
| 2007/0218280 A1 | 9/2007 | Yabuki et al. |
| 2007/0253890 A1 | 11/2007 | Nakayama et al. |
| 2007/0259128 A1 | 11/2007 | Parsapour |
| 2007/0298669 A1 | 12/2007 | Barrera et al. |
| 2008/0014431 A1 | 1/2008 | Lashmore et al. |
| 2008/0020193 A1 | 1/2008 | Jang et al. |
| 2008/0023396 A1 | 1/2008 | Fugetsu |
| 2008/0048364 A1 | 2/2008 | Armeniades et al. |
| 2008/0053922 A1 | 3/2008 | Honsinger, Jr. et al. |
| 2008/0069760 A1 | 3/2008 | O'Brien et al. |
| 2008/0075954 A1 | 3/2008 | Wardle et al. |
| 2008/0118753 A1 | 5/2008 | Poulin et al. |
| 2008/0135815 A1 | 6/2008 | Glatkowski et al. |
| 2008/0160286 A1 | 7/2008 | Asrar et al. |
| 2008/0160302 A1 | 7/2008 | Asrar et al. |
| 2008/0170982 A1 | 7/2008 | Zhang et al. |
| 2008/0181839 A1 | 7/2008 | Arendt et al. |
| 2008/0182108 A1 | 7/2008 | Curliss et al. |
| 2008/0187648 A1 | 8/2008 | Hart et al. |
| 2008/0213498 A1 | 9/2008 | Drzal et al. |
| 2008/0247938 A1 | 10/2008 | Tsai et al. |
| 2008/0247939 A1 | 10/2008 | Iyuke |
| 2008/0274036 A1 | 11/2008 | Resasco et al. |
| 2008/0279753 A1 | 11/2008 | Harutyunyan |
| 2008/0280031 A1 | 11/2008 | Drzal et al. |
| 2008/0280136 A1* | 11/2008 | Zachariah et al. ............ 428/367 |
| 2008/0286564 A1 | 11/2008 | Tsotsis |
| 2008/0287598 A1 | 11/2008 | Lee |
| 2008/0290787 A1 | 11/2008 | Cok |
| 2008/0305329 A1 | 12/2008 | D'Silva et al. |
| 2008/0308209 A1 | 12/2008 | Loutfy et al. |
| 2009/0017301 A1 | 1/2009 | Moireau |
| 2009/0020734 A1 | 1/2009 | Jang et al. |
| 2009/0021136 A1 | 1/2009 | Coll et al. |
| 2009/0047453 A1 | 2/2009 | Folaron et al. |
| 2009/0047502 A1 | 2/2009 | Folaron et al. |
| 2009/0068387 A1 | 3/2009 | Panzer et al. |
| 2009/0068461 A1 | 3/2009 | Reneker et al. |
| 2009/0081383 A1 | 3/2009 | Alberding et al. |
| 2009/0081441 A1 | 3/2009 | Shah et al. |
| 2009/0092832 A1 | 4/2009 | Moireau |
| 2009/0099016 A1 | 4/2009 | Carruthers et al. |
| 2009/0116798 A1 | 5/2009 | Blanchandin et al. |
| 2009/0121219 A1 | 5/2009 | Song et al. |
| 2009/0126783 A1 | 5/2009 | Lin et al. |
| 2009/0136707 A1 | 5/2009 | Ueno |
| 2009/0140098 A1 | 6/2009 | Lengsfeld et al. |
| 2009/0176100 A1 | 7/2009 | Higashi et al. |
| 2009/0176112 A1 | 7/2009 | Kruckenberg et al. |
| 2009/0186214 A1 | 7/2009 | Lafdi et al. |
| 2009/0191352 A1 | 7/2009 | DuFaux et al. |
| 2009/0192241 A1 | 7/2009 | Raravikar et al. |
| 2009/0202422 A1* | 8/2009 | Kajiura et al. ............ 423/447.2 |
| 2009/0212430 A1 | 8/2009 | Wyland |
| 2009/0214800 A1 | 8/2009 | Saito |
| 2009/0220409 A1 | 9/2009 | Curliss et al. |
| 2009/0258164 A1 | 10/2009 | Nakai et al. |
| 2009/0286079 A1 | 11/2009 | Barker et al. |
| 2009/0294753 A1 | 12/2009 | Hauge et al. |
| 2009/0311166 A1 | 12/2009 | Hart et al. |
| 2009/0311168 A1 | 12/2009 | Duvall |
| 2009/0318614 A1 | 12/2009 | Chevalier |
| 2009/0325377 A1 | 12/2009 | DiJon et al. |
| 2010/0000770 A1 | 1/2010 | Gupta et al. |
| 2010/0059243 A1 | 3/2010 | Chang |
| 2010/0074834 A1 | 3/2010 | Kim |
| 2010/0092841 A1 | 4/2010 | Lopez et al. |
| 2010/0098931 A1 | 4/2010 | Daniel et al. |
| 2010/0099319 A1 | 4/2010 | Lashmore et al. |
| 2010/0117764 A1 | 5/2010 | Wang et al. |
| 2010/0159240 A1 | 6/2010 | Shah et al. |
| 2010/0178825 A1 | 7/2010 | Shah et al. |
| 2010/0188833 A1 | 7/2010 | Liang et al. |
| 2010/0192851 A1 | 8/2010 | Shah et al. |
| 2010/0196697 A1 | 8/2010 | D'Silva et al. |
| 2010/0197848 A1 | 8/2010 | Verghese et al. |
| 2010/0200208 A1 | 8/2010 | Cola et al. |
| 2010/0206504 A1 | 8/2010 | Akiyama et al. |
| 2010/0210159 A1 | 8/2010 | Zhu |
| 2010/0221424 A1 | 9/2010 | Malecki et al. |
| 2010/0224129 A1 | 9/2010 | Malecki et al. |
| 2010/0227134 A1 | 9/2010 | Shah et al. |
| 2010/0254885 A1 | 10/2010 | Menchhofer et al. |
| 2010/0260931 A1 | 10/2010 | Malecki et al. |
| 2010/0260933 A1 | 10/2010 | Malecki et al. |
| 2010/0260998 A1 | 10/2010 | Waicukauski et al. |
| 2010/0272891 A1 | 10/2010 | Malecki et al. |
| 2010/0276072 A1 | 11/2010 | Shah et al. |
| 2010/0279569 A1 | 11/2010 | Shah et al. |
| 2010/0311866 A1 | 12/2010 | Huang et al. |
| 2011/0014446 A1 | 1/2011 | Saito |
| 2011/0024409 A1 | 2/2011 | Shah et al. |
| 2011/0024694 A1 | 2/2011 | Shah |
| 2011/0132245 A1 | 6/2011 | Shah et al. |
| 2011/0186775 A1 | 8/2011 | Shah et al. |
| 2011/0203927 A1 | 8/2011 | Draper et al. |
| 2011/0241244 A1 | 10/2011 | Liu |
| 2011/0256336 A1 | 10/2011 | Koike |
| 2012/0065300 A1 | 3/2012 | Shah et al. |
| 2012/0070667 A1 | 3/2012 | Malet et al. |
| 2012/0122020 A1 | 5/2012 | Hata et al. |
| 2012/0251432 A1 | 10/2012 | Cooper et al. |

FOREIGN PATENT DOCUMENTS

| | | |
|---|---|---|
| CN | 1379740 A | 11/2002 |
| CN | 1418260 A | 5/2003 |
| CN | 1477260 A | 2/2004 |
| CN | 1504407 A | 6/2004 |
| CN | 1558441 A | 12/2004 |

(56) References Cited

FOREIGN PATENT DOCUMENTS

| | | |
|---|---|---|
| CN | 1696337 A | 11/2005 |
| CN | 1826286 A | 8/2006 |
| CN | 1919727 A | 2/2007 |
| CN | 101012621 A | 8/2007 |
| CN | 101049927 | 10/2007 |
| CN | 101070250 A | 11/2007 |
| CN | 101095230 A | 12/2007 |
| CN | 101173386 A | 5/2008 |
| CN | 101177803 A | 5/2008 |
| CN | 101365830 A | 2/2009 |
| CN | 101372327 A | 2/2009 |
| CN | 101372329 | 2/2009 |
| CN | 101378988 | 3/2009 |
| CN | 101541860 A | 9/2009 |
| CN | 101698975 | 4/2010 |
| CN | 101746717 A | 6/2010 |
| EP | 0098315 A1 | 1/1984 |
| EP | 1637828 A2 | 3/2006 |
| EP | 1939149 A2 | 7/2008 |
| GB | 2399092 A | 9/2004 |
| GB | 2458776 A * | 10/2009 |
| GB | 2458776 A | 10/2009 |
| IN | 01900DE2008 A | 3/2010 |
| JP | 01-283376 A | 11/1989 |
| JP | H04-334823 A | 11/1992 |
| JP | 08-192044 A | 7/1996 |
| JP | 09-012343 | 1/1997 |
| JP | H11-139815 A | 5/1999 |
| JP | 2000-309870 A | 11/2000 |
| JP | 2002-115071 A | 4/2002 |
| JP | 2003-502507 A | 1/2003 |
| JP | 2003-171108 A | 6/2003 |
| JP | 2003-239171 A | 8/2003 |
| JP | 2004-015600 A | 1/2004 |
| JP | 2004-284919 A | 10/2004 |
| JP | 2004-327085 A | 11/2004 |
| JP | 2005-162571 A | 6/2005 |
| JP | 2005-213700 | 8/2005 |
| JP | 2006-026533 A | 2/2006 |
| JP | 2006-069816 A | 3/2006 |
| JP | 2006-255817 A | 9/2006 |
| JP | 2006-342011 | 12/2006 |
| JP | 2007-091556 A | 4/2007 |
| JP | 2007-117881 A | 5/2007 |
| JP | 2007-523822 A | 8/2007 |
| JP | 2008-063196 A | 3/2008 |
| JP | 2008-063718 A | 3/2008 |
| JP | 2008-535752 A | 9/2008 |
| JP | 2008-535763 A | 9/2008 |
| JP | 2008-266057 A | 11/2008 |
| JP | 2008-296338 A | 12/2008 |
| JP | 2009-021038 A | 1/2009 |
| JP | 2009-535530 A | 10/2009 |
| JP | 2011-071049 A | 4/2011 |
| KR | 100829001 | 5/2008 |
| TW | 200833861 | 8/2008 |
| TW | 201217827 A | 5/2012 |
| WO | WO-99/58756 | 11/1999 |
| WO | WO 01-39970 | 6/2001 |
| WO | WO 03-082733 | 10/2003 |
| WO | WO-2005/007564 A1 | 1/2005 |
| WO | WO-2005/012171 A2 | 2/2005 |
| WO | WO-2005037470 A2 | 4/2005 |
| WO | WO-2005075341 A2 | 8/2005 |
| WO | WO 2006-048531 | 5/2006 |
| WO | WO-2006/064760 A1 | 6/2006 |
| WO | WO-2006/107144 A1 | 10/2006 |
| WO | WO 2006-115486 | 11/2006 |
| WO | WO 2007-015710 | 2/2007 |
| WO | WO-2007020362 A2 | 2/2007 |
| WO | WO 2007-061854 | 5/2007 |
| WO | WO 2007-089118 | 8/2007 |
| WO | WO 2007-130979 | 11/2007 |
| WO | WO-2007/136755 A2 | 11/2007 |
| WO | WO-2007136613 A2 | 11/2007 |
| WO | WO 2007-149109 | 12/2007 |
| WO | WO-2008/025750 A1 | 3/2008 |
| WO | WO 2008-041183 | 4/2008 |
| WO | WO 2008-054541 | 5/2008 |
| WO | WO 2008-085634 | 7/2008 |
| WO | WO 2008-115640 | 9/2008 |
| WO | WO-2008/153609 A1 | 12/2008 |
| WO | WO 2009-004346 | 1/2009 |
| WO | WO-2009/008291 A1 | 1/2009 |
| WO | WO 2009-110885 | 9/2009 |
| WO | WO 2010-087903 | 8/2010 |
| WO | WO-2010/129234 A2 | 11/2010 |

OTHER PUBLICATIONS

Mayya, et al., "Diameter Controlled Synthesis of Carbon Nanotubes by CVD Using Steric-Stabilized Nanoparticle Catalysts", NSTI-Nanotech, 2006, vol. 1, pp. 98-101.

Definition of nanoparticle provided by Dictionary.com, accessed Nov. 2, 2012, retrieved from <http://dictionary.reference.com/browse/nanoparticle>.

Qu, et al., "Carbon Microfibers Sheathed with Aligned Carbon Nanotubes: Towards Multidimensional Multicomponent and Multifunctional Nanomaterials," Small, 2006, pp. 1052-1059, vol. 2, No. 8-9.

"Conformal coating", The Free Dictionary by Farlex, last viewed Jan. 15, 2013, retrieved from <http://encyclopedia.thefreedictionary.com/conformal+coating>.

Keyvani, "Huge Opportunities for Industry of Nanofibrous Concrete Technology," International Journal of Nanoscience and Nonotechnology, Dec. 2007, pp. 3-11, vol. 3, No. 1.

Zhang et al., "Integration and characterization of aligned carbon nanotubes on metal/silicon substrates and effects of water", Applied Surface Science 255 (2009) 5003-5008.

Emmenegger, et al., "Carbon Nanotube Synthesized on Metallic Substrate," Applied Surface Science, 2000, pp. 452-456.

Hart, et al., "Desktop Growth of Carbon-Nanotube Monoliths with in Situ Optical Imaging," Small, 2007, pp. 772-777, vol. 3, No. 5.

Hasegawa, et al., "Millimeter-Tall Single-Walled Carbon Nanotubes Rapidly Grown with and without Water," ACS Nano, 2011, pp. 975-984, vol. 5, No. 2.

Zhong, et al., "Growth Kinetics of 0.5cm Vertically Aligned Single-Walled Carbon Nanotubes", The Journal of Physical Chemistry B (Letters), Feb. 6, 2007, pp. 1907-1910, vol. 111, No. 8.

Yamamoto, et al., "High-yield growth and morphology control of aligned carbon nanotubes on ceramic fibers for multifunctional enhancement of structural composites," Carbon, Mar. 2009, vol. 47, No. 3, pp. 551-560.

Ci, et al., "Direct growth of carbon nanotubes on the surface of ceramic fibers," Carbon, Jan. 2005, vol. 43, No. 4, pp. 883-886.

Ago, et al., "Colloidal Solution of Metal Nanoparticles as a Catalyst for Carbon Nanotube Growth", Proceedings Materials Research Society, Fall 2000, pp. A13.18.1-A13.18.5, vol. 633, Materials Research Society.

Aramid Fibers, DuPong Nemours, Inc. Apr. 30, 2001, http/www.chem.uwec.edu/Chem405_SOI/malenirt/project.html, pp. 1-10.

Bradford, et al., "Electrical Conductivity Study of Carbon nanotube Yarns, 3-D Hybrid Braids and their Composites", Jouranl of Composite Materials, pp. 1533-1545, vol. 42, No. 15, SAGE Productions, Los Angeles, London, New Delhi and Singapore.

Bubert, et al., "Basic analytical investigation of plasma-chemically modified carbon fibers", Spectrochimica Acta Part B., 2002, pp. 1601-1610, vol. 57, Elsevier Science B.V.

Chae, et al., "A comparison of reinforcement efficiency of various types of carbon nanotubes in polyacrylonitrile fiber", Polymer, Nov. 21, 2005, pp. 10925-10935, vol. 46, No. 24, Elsevier Ltd.

Che, et al., "Chemical Vapor Deposition Based Synthesis of Carbon Nanotubes and Nanofibers Using a Template Method", Chem. Mater., 1998, pp. 260-267, vol. 10, American Chemical Society.

Chen, et al., "Basalt fiber-epoxy laminates with functionalized multi-walled carbon nanotubes", Composites, Part A, 2009, pp. 1082-1089, vol. 40, Elsevier Ltd.

Chen, et al., "Pulsed electrodeposit of Pt nanoclusters on carbon nanotubes modified carbon materials using diffusion restricting vis- (56) References Cited

OTHER PUBLICATIONS cous electroyles", Electrochemistry Communications, Jun., 2007, pp. 1348-1354, vol. 9, Elsevier B.V.

Ci, et al., "Direct Growth of Carbon Nanotubes on the Surface of Ceramic Fibers", Carbon, 2005, pp. 883-886, vol. 43, No. 4, Elsevier Ltd.

Franz, et al., "Carbon Single-Wall Nanotube Growth in a Volumetrically Confined Arc Discharge System", U.S. Departement of Energy Journal of Undergraduate Research, pp. 66-69, publication date unknown.

Garcia, et al., "Aligned Carbon Nanotube Reinforcement of Advanced Composite Ply Interfaces," 49th AIAA/ASCE/AHS/ASC Structures, Structural Dynamics, and Materials Conference, Apr. 7-10 2008, Schaumburg, IL, MIT, American Institute of Aeronautics and Astronautics, Inc.

Hsu, et al., "Optical Absorption and Thermal Transport of Individual Suspended Carbon Nanotube Bundles", Nano Lett., 2009, pp. 590-594, vol. 9, No. 2, American Chemical Society, Publication Date (Web): Jan. 13, 2009.

Jiang, et al., "Carbon nanotube-coated solid-phase microextraction metal fiber based on sol-gel technique", Journal of Chromatography A., May 29, 2009, pp. 4641-4647, vol. 1216, Elsevier B.V.

Jiang, et al., "Plasma-Enhanced Deposition of Silver Nanoparticles onto Polymer and Metal Surfaces for the Generation of Antimicrobial Characteristics", Journal of Applied_Polymer Science, 2004, pp. 1411-1422, vol. 93, Wiley Periodicals, Inc.

Jung, et al., "Fabrication of radar absorbing structure (RAS) using GFR-nano composite and spring-back compensation of hybrid composite RAS shells", Composite Structures, 2006, pp. 571-576, vol. 75, Elsevier Ltd.

Kim, et al., "Processing, characterization, and modeling of carbon nanotube-reinforced multiscale composites," Composites Science and Technology, 2009, pp. 335,342, vol. 69, Elsevier Ltd.

Kind, et al., "Patterned Films of Nanotubes Using Microcontact Printing of Catalysts", Adv. Mater., 1999, pp. 1285-1289, vol. 11, No. 15, Wiley-VCH Verlag GmbH, D-69469 Weinheim.

Kramer, et al., Constrained Iron Catalysts for Single-Walled Carbon Nanotube Growth?, Langmuir 2005, 21, 8466-8470 [http://pubs.acs.org/dol.abs/10.1021/1a0506729].

Laachachi, et al., "A chemical method to graft carbon nanotubes onto a carbon fiber", Materials Letters, 2008, pp. 394-397, vol. 62, Elsevier B.V.

Lee, "Syntheses and properties of fluorinated carbon materials", Journal of Fluorine Chemistry, 2007, pp. 392-403, vol. 128, Elsevier B.V.

Lee, et al., "Fabrication and design of multi-layered radar absorbing structures of MWNT-filled glass/epoxy plain-weave composites", Composite Structures, 2006, pp. 397-405, vol. 76, Elsevier Ltd.

Li, et al., "A Miniature glucose/$O_2$ biofuel cell with single-walled carbon nanotubes-modified carbon fiber microelectrodes as the substrate", Electrochemistry Communications, Jun. 2008, pp. 851-854, vol. 10, Elsevier B.V.

Li, et al., "Electromagnetic Interference (EMI) Shielding of Single-Walled Carbon Nanotube Epoxy Composites", Nano Lett., 2006, pp. 1141-1145, vol. 6, No. 6, American Chemical Society.

Lux, Rudolf, "PCT Application No. PCT/US2007/086875 Search Report and Written Opinion", May 13, 2008.

Makris, et al., "Carbon Nanotubes Growth and Anchorage to Carbon Fibres", Carbon Nanotubes, 2006, pp. 57-58, vol. 222, Springer, the Netherlands.

Meyyappan, et al., "Carbon nanotube growth by PECVD: a review", Plasma Sources Sci. Technol., 2003, pp. 205-216, vol. 12, IOP Publishing Ltd, UK.

Mylvaganam, "Fabrication and Application of Polymer Composites Comprising Carbon Nanotubes", Recent Pat Nanotechnol., 2007, pp. 59-65, vol. 1, Bentham Science Publishers, Ltd.

Panhuis, et al., "Carbon Nanotube Mediated Reduction in Optical Activity in Polyaniline Composite Materials", J. Phys. Chem. C, 2008, pp. 1441-1445, vol. 112, American Chemical Society.

Pisco, et al., "Hollow fibers integrated with single walled carbon nanotubes: Bandgap modification and chemical sensing capability", Sensors and Actuators B, 2008, pp. 163-170, vol. 129, Elsevier B.V.

Račkauskas "Carbon nanotube growth and use in energy sector", Energetika, 2006, pp. 43-46, vol. 2.

Satishkumar, et al., "Bundles of aligned carbon nanotubes obtained by the pyrolysis of ferrocene-hydrocarbon mixtures: role of the metal nanoparticles produced in situ", Chemical Physics Letters, 1999, pp. 158-162, vol. 307, Elsevier Science B.V.

Suh, et al., "Highly ordered two-dimensional carbon nanotube arrays", Applied Physics Letters, Oct. 4, 2002, pp. 2047-2049, vol. 75, No. 14, American Institute of Physics.

Thostenson, et al., "Carbon nanotube/carbon fiber hybrid multiscale composites", J. Appl. Phys., 2002, pp. 6034-6037, vol. 91, No. 9, American Institute of Physics.

U.S. Appl. No. 12/766,817, filed Apr. 23, 2010.
U.S. Appl. No. 61/295,621, filed Jan. 15, 2010.
U.S. Appl. No. 61/297,704, filed Jan. 22, 2010.

Wang, et al., "Penetration depth of atmospheric pressure plasma surface modification into multiple layers of polyester fabrics", Surface and Coatings Technology, 2007, pp. 77-83, vol. 202, Elsevier B.V.

Wang, et al., "Processing and property investigation of single-walled carbon nanotube (SWNT) buckypaper/epoxy resin matrix nanocomposites", Composites, Part A, 2004, pp. 1225-1232, vol. 35, Elsevier Ltd.

Wichmann, et al., "Glass-fibre-reinforced composites with enhanced mechanical and electrical properties—Benefits and limitations of a nanoparticle modified matrix", Engineering Fracture Mechanics, 2006, pp. 2346-2359, vol. 73, Eliesvier Ltd.

Xu, et al., "Bone-Shaped Nanomaterials for Nanocomposite Applications", Nano Lett., 2003, pp. 1135-1139, vol. 3, No. 8, American Chemical Society.

Yabe, et al., Synthesis of well-aligned carbon nanotubes by radio frequency plasma enhanced CVD method, Diamond and Related Materials, 2004, pp. 1292-1295, vol. 13, Elsevier B.V.

Yanagishita, et al., "Carbon Nanotubes with a Triangular Cross-section, Fabricated Using Anodic Porous Alumina as the Temple", Adv. Mater., 204, pp. 429-432, vol. 16, No. 5, WILEY-VCH Verlag GmbH & Co. KGaA, Weinheim.

Yang, et al., "Electrical Conductivity and Electromagnetic Interference Shielding of Multi-walled Carbon Nanotube Filled Polymer Composites" Mater. Res. Soc. Symp. Proc., 2005. pp. HH5.3.1-HH. 5.3.5, vol. 858E, Materials Research Society.

Yeh, et al., "Mechanical properties of phenolic-based nanocomposites reinforced by multi-walled carbon nanotubes and carbon fibers", Composites: Part A, 2008, pp. 677-684, vol. 39, No. 4.

Zhang, et al., "In situ growth of carbon nanotubes on inorganic fibers with different surface properties," Materials Chemistry and Physics, 2008, pp. 317-321, vol. 107, Science Direct.

Zhao, et al., "Growth of carbon nanotubes on the surface of carbon fibers", Carbon, 2007, pp. 380-383, vol. 46, No. 2, Elsevier Ltd.

Zhao, et al., "The growth of multi-walled carbon nanotubes with different morphologies on carbon fibers", Carbon, 2005, pp. 651-673, vol. 43, Elsevier Ltd.

Zhu, et al., "Carbon nanotube growth on carbon fibers", Diamond and Related Materials, 2003, pp. 1825-1825, vol. 12, Elsevier B.V.

Zhu, et al., "Synthesis of single-walled carbon nanotubes by the vertical floating catalyst method," Chinese Science Bulletin, 2002, pp. 159-162, vol. 47, No. 2.

Hart, et al., "Growth of conformal single-walled carbon nanotube films from MO/Fe/$AL_2O_3$ deposited by electron beam evaporation," Carbon (2006) vol. 44, pp. 348-359.

* cited by examiner

GLASS SUBSTRATES HAVING CARBON NANOTUBES GROWN THEREON AND METHODS FOR PRODUCTION THEREOF

CROSS-REFERENCE TO RELATED APPLICATIONS

This application claims the benefit of priority under 35 U.S.C. §119 from U.S. Provisional Patent Application Ser. No. 61/382,861, filed Sep. 14, 2010, which is incorporated herein by reference in its entirety.

STATEMENT REGARDING FEDERALLY SPONSORED RESEARCH OR DEVELOPMENT

Not applicable.

FIELD OF THE INVENTION

The present invention generally relates to carbon nanotubes, and, more specifically, to carbon nanotube growth.

BACKGROUND

Carbon nanotubes have been proposed to have utility in a number of applications due to their large effective surface area, mechanical strength, and thermal and electrical conductivity. Many of these applications are particularly well suited for carbon nanotubes grown on glass substrates (e.g., glass fiber composite materials).

In order to synthesize carbon nanotubes, a catalyst is generally needed to mediate carbon nanotube growth. Most often the catalyst is a metal nanoparticle, particularly a zero-valent transition metal nanoparticle. A number of methods for synthesizing carbon nanotubes are known in the art including, for example, micro-cavity, thermal- or plasma-enhanced chemical vapor deposition (CVD), laser ablation, arc discharge, flame synthesis, and high pressure carbon monoxide (HiPCO) techniques. Generally, such methods for synthesizing carbon nanotubes involve generating reactive gas phase carbon species under conditions suitable for carbon nanotube growth.

Synthesis of carbon nanotubes on solid substrates, including glass substrates, can be carried out using many of these techniques. However, carbon nanotube growth rates on glass substrates have heretofore been insufficient to facilitate high throughput syntheses in continuous processes. As a result of this difficulty, undesirably short carbon nanotubes can be produced or undesirably slow process line speeds can be required.

In view of the foregoing, processes for growing carbon nanotubes on glass substrates at high growth rates would be of substantial benefit in the art. The present disclosure satisfies this need and provides related advantages as well.

SUMMARY

In various embodiments, carbon nanotube growth processes are described herein. In some embodiments, the carbon nanotube growth processes include depositing a catalytic material on a glass substrate, depositing a non-catalytic material on the glass substrate, and after depositing the catalytic material and the non-catalytic material, exposing the glass substrate to carbon nanotube growth conditions so as to grow carbon nanotubes thereon.

In some embodiments, the carbon nanotube growth processes include depositing a catalyst precursor on a glass fiber substrate, depositing a non-catalytic material on the glass fiber substrate, converting the catalyst precursor into a catalyst that is operable for forming carbon nanotubes when exposed to carbon nanotube growth conditions, and exposing the glass fiber substrate to carbon nanotube growth conditions while the glass fiber substrate is being transported so as to grow carbon nanotubes thereon.

In some embodiments, the carbon nanotube growth processes include allowing a solution containing water, hydrogen peroxide, an iron (II) salt or a hydrate thereof, and a cobalt (II) salt or a hydrate thereof to form a catalyst precursor in the solution; depositing the catalyst precursor on a glass fiber substrate; depositing a non-catalytic material on the glass fiber substrate; converting the catalyst precursor into a catalyst that is operable for forming carbon nanotubes upon exposure to carbon nanotube growth conditions; and exposing the glass fiber substrate to carbon nanotube growth conditions so as to grow carbon nanotubes thereon.

In some embodiments, glass fiber substrates containing carbon nanotubes grown thereon can be produced by the carbon nanotube growth processes described herein.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

The present disclosure is directed, in part, to processes for growing carbon nanotubes on glass substrates, particularly glass fiber substrates. The present disclosure is also directed, in part, to glass fiber substrates containing carbon nanotubes grown thereon that are produced by the present carbon nanotube growth processes.

A leading advantage of the carbon nanotube growth processes described herein is that significantly enhanced carbon nanotube growth rates on glass substrates can be realized. This feature makes the present carbon nanotube growth processes amenable to high throughput syntheses needed for industrial production. In addition, some embodiments of the present carbon nanotube growth processes use water for depositing a carbon nanotube-forming catalyst or catalyst precursor, which can lower production costs relative to comparable processes using organic solvents and lessen environmental impacts.

Carbon nanotube growth processes of the present disclosure can be conducted with the glass substrate being held stationary (static) in batchwise processing or with the glass substrate being transported (e.g. through a carbon nanotube synthesis reactor) while carbon nanotubes are being grown thereon. In various embodiments, the carbon nanotube growth processes described herein can be conducted while the glass substrate, particularly a glass fiber substrate, is being transported while being exposed to carbon nanotube growth conditions. This feature beneficially allows high throughput growth of carbon nanotubes to be realized. In addition, the catalysts and catalyst precursors described herein can allow greater carbon nanotube growth rates to be realized on glass substrates than are conventionally known in the art. Given these benefits of the present disclosure, one of ordinary skill in the art will recognize the advantages of carbon nanotube growth processes in which the glass substrate is transported during carbon nanotube growth. In spite of the advantages of transporting glass substrates during carbon nanotube growth, it should also be understood that any of the carbon nanotube growth processes described herein can also be conducted in a batchwise (static) manner in alternative embodiments.

Carbon nanotubes have demonstrated utility in a number of applications that take advantage of their unique structure and properties including, for example, large effective surface area, mechanical strength, electrical conductivity, and thermal conductivity. When grown on a glass substrate, carbon nanotubes and the glass substrate form a composite architecture that advantageously allows the beneficial properties of the carbon nanotubes to be imparted to the glass substrate. In some embodiments, however, a glass substrate can simply be used as a sacrificial carrier in order to deliver large quantities of carbon nanotubes into another matrix (e.g., a polymer matrix of a composite material).

In some embodiments, carbon nanotubes grown on a glass substrate can be chemically or mechanically adhered to the substrate. Carbon nanotubes grown on a glass substrate (i.e., infused carbon nanotubes) by the present methods are more strongly adhered to the substrate than would be pre-synthesized carbon nanotubes held in place by simple van der Waals physiosorption interactions. Hence, the present glass substrates having carbon nanotubes grown thereon are distinguished from glass substrates having pre-formed carbon nanotubes deposited thereon (e.g., from a carbon nanotube solution or suspension). Further, by directly growing the carbon nanotubes on the glass substrate, the carbon nanotubes can be obtained in a substantially unbundled state as individual carbon nanotubes. In some embodiments, the carbon nanotubes can be directly bonded to the glass substrate. In other embodiments, the carbon nanotubes can be indirectly bonded to the glass substrate via a catalytic material used to mediate the carbon nanotubes' synthesis and/or via a non-catalytic material deposited on the glass substrate.

As used herein, the term "nanoparticle" refers to particles having a diameter between about 0.1 nm and about 100 nm in equivalent spherical diameter, although nanoparticles need not necessarily be spherical in shape.

As used herein, the term "catalyst" refers to a substance that is operable to form carbon nanotubes when exposed to carbon nanotube growth conditions. As used herein, the term "catalytic nanoparticle" refers to a nanoparticle that is operable to form carbon nanotubes when exposed to carbon nanotube growth conditions. As used herein, the term "catalyst precursor" refers to a substance that can be converted into a catalyst. As used herein, the term "catalytic material" refers to a catalyst and/or a catalyst precursor.

As used herein, the term "transition metal" refers to any element or alloy of elements in the d-block of the periodic table (Groups 3 through 12), and the term "transition metal salt" refers to any transition metal compound such as, for example, transition metal oxides, nitrates, chlorides, bromides, iodides, fluorides, acetates, citrates, carbides, nitrides, and the like. Illustrative transition metals that can be catalytic for synthesizing carbon nanotubes include, for example, Ni, Fe, Co, Mo, Cu, Pt, Au, Ag, alloys thereof, salts thereof, and mixtures thereof.

As used herein, the terms "spoolable lengths" or "spoolable dimensions" equivalently refer to a material that has at least one dimension that is not limited in length, thereby allowing the material to be stored on a spool or mandrel, for example, in a reel-to-reel process. A material of "spoolable lengths" or "spoolable dimensions" has at least one dimension that allows the growth of carbon nanotubes thereon while the material is being transported. However, a material of spoolable lengths can also have carbon nanotubes grown thereon in a batchwise (static) manner, if desired.

As used herein, the term "carbon nanotube growth conditions" refers to any process that is capable of growing carbon nanotubes in the presence of a suitable catalyst. Generally, carbon nanotube growth conditions generate a reactive carbon species, oftentimes by the pyrolysis of an organic compound.

In some embodiments, the carbon nanotube growth processes described herein include depositing a catalytic material on a glass substrate, depositing a non-catalytic material on the glass substrate, and after depositing the catalytic material and the non-catalytic material, exposing the glass substrate to carbon nanotube growth conditions so as to grow carbon nanotubes thereon. In some embodiments, the processes can further include transporting the glass substrate while the carbon nanotubes are being grown thereon. In various embodiments, the catalytic material can be deposited before, after, or concurrently with the non-catalytic material.

The form of the glass substrate can vary without limitation in the present embodiments. However, in some embodiments, the form of the glass substrate is generally compatible its being transported (e.g., in a reel-to-reel process) during carbon nanotube growth. A suitable glass substrate that can be transported is a glass fiber or various fiber forms that are made from glass fibers. In some embodiments, the glass substrate can be in non-limiting forms such as, for example, glass fibers, glass filaments, glass wires, glass rovings, glass yarns, glass fiber tows, glass tapes, glass ribbons, glass wire meshes, glass tubes, glass films, glass braids, woven glass fabrics, non-woven glass fabrics, glass fiber plies, and glass fiber mats. Higher order forms such as, for example, woven and non-woven glass fabrics, glass fiber plies, and glass wire meshes can be formed from lower order glass substrates such as, for example, glass fibers, glass filaments, glass fiber tows, and the like. That is, glass fibers, glass filaments, glass fiber tows, and the like can have carbon nanotubes grown thereon, with formation of the higher order forms taking place thereafter. In other embodiments, such higher order forms can be preformed with growth of carbon nantubes thereon taking place thereafter. As used herein, the foregoing glass substrate forms will be collectively referred to as glass fibers.

Filaments include high aspect ratio fibers having diameters generally ranging in size between about 1 μm and about 100 μm. Rovings include soft strands of fiber that have been twisted, attenuated and freed of foreign matter.

Yarns include closely associated bundles of twisted filaments, wherein each filament diameter in the yarn is relatively uniform. Yarns have varying weights described by their 'tex,' (expressed as weight in grams per 1000 linear meters), or 'denier' (expressed as weight in pounds per 10,000 yards). For yarns, a typical tex range is usually between about 200 and about 2000.

Fiber braids represent rope-like structures of densely packed fibers. Such rope-like structures can be assembled from yarns, for example. Braided structures can include a hollow portion. Alternately, a braided structure can be assembled about another core material.

Fiber tows include associated bundles of untwisted filaments. As in yarns, filament diameter in a fiber tow is generally uniform. Fiber tows also have varying weights and a tex range that is usually between about 200 and about 2000. In addition, fiber tows are frequently characterized by the number of thousands of filaments in the fiber tow, such as, for example, a 12K tow, a 24K tow, a 48K tow, and the like.

Tapes are fiber materials that can be assembled as weaves or as non-woven flattened fiber tows, for example. Tapes can vary in width and are generally two-sided structures similar to a ribbon. In the various embodiments described herein, carbon nanotubes can be grown on a tape on one or both sides of the tape. In addition, carbon nanotubes of different types, diameters or lengths can be grown on each side of a tape, which can be advantageous in certain applications.

In some embodiments, fiber materials can be organized into fabric or sheet-like structures. These include, for example, woven fabrics, non-woven fiber mats, meshes and fiber plies, in addition to the tapes described above.

The types of carbon nanotubes grown on the glass substrates can generally vary without limitation. In various embodiments, the carbon nanotubes grown on the glass substrates can be, for example, any of a number of cylindrically-shaped allotropes of carbon of the fullerene family including single-wall carbon nanotubes, double-wall carbon nanotubes, multi-wall carbon nanotubes, and any combination thereof. One of ordinary skill in the art will recognize that the types of carbon nanotubes grown on the glass substrate can be varied by adjusting the carbon nanotube growth conditions, particularly the catalyst composition and catalytic nanoparticle size used to control the growth of the carbon nanotubes. In some embodiments, the carbon nanotubes can be capped with a fullerene-like structure. That is, the carbon nanotubes have closed ends in such embodiments. However, in other embodiments, the carbon nanotubes can remain open-ended. In some embodiments, closed carbon nanotube ends can be opened through treatment with an appropriate oxidizing agent (e.g., $HNO_3/H_2SO_4$). In some embodiments, the carbon nanotubes can encapsulate other materials after being grown on the glass substrate. In some embodiments, the carbon nanotubes can be covalently functionalized after being grown on the glass substrate. In some embodiments, a plasma process can be used to promote functionalization of the carbon nanotubes.

Carbon nanotubes can be metallic, semimetallic or semiconducting depending on their chirality. An established system of nomenclature for designating a carbon nanotube's chirality is recognized by one having ordinary skill in the art and is distinguished by a double index (n,m), where n and m are integers that describe the cut and wrapping of hexagonal graphite when formed into a tubular structure. In various embodiments, carbon nanotubes grown on glass substrates according to the present embodiments can be of any specified chirality or mixture of chiral forms.

In addition to chirality, a carbon nanotube's diameter also influences its electrical conductivity and the related property of thermal conductivity. In the synthesis of carbon nanotubes, a carbon nanotube's diameter can be controlled by using catalytic nanoparticles of a given size. Typically, a carbon nanotube's diameter is approximately that of the catalytic nanoparticle that catalyzes its formation. Therefore, a carbon nanotube's properties can be controlled in one respect by adjusting the catalyst composition used for its synthesis, for example. By way of non-limiting example, catalytic nanoparticles having a diameter of about 1 nm to about 5 nm can be used to grow predominantly single-wall carbon nanotubes. Larger catalytic nanoparticles can be used to prepare predominantly multi-wall carbon nanotubes, which have larger diameters because of their multiple nanotube layers. Mixtures of single-wall and multi-wall carbon nanotubes can also be grown by using larger catalytic nanoparticles in the carbon nanotube synthesis. Catalytic nanoparticles of a desired size can be purchased from various commercial sources, or they can be prepared in situ from a catalyst precursor according to the present embodiments.

In various embodiments herein, the diameter of the carbon nanotubes grown on the glass substrate can range between about 1 nm and about 500 nm in size. In some embodiments, the diameter of the carbon nanotubes can range between about 1 nm and about 10 nm in size. In other embodiments, the diameter of the carbon nanotubes can range between about 1 nm and about 25 nm in size, or between about 5 nm and about 25 nm in size, or between about 5 nm and about 30 nm in size. In some embodiments, the diameter of the carbon nanotubes can range between about 10 nm and about 50 nm in size or between about 50 nm and about 100 nm in size. In other embodiments, the diameter of the carbon nanotubes can range between about 100 nm and about 300 nm in size or between about 300 nm and about 500 nm in size. At very high concentrations of the catalytic material, agglomeration during heating can lead to larger catalytic nanoparticles that produce carbon nanotubes of about 50 nm in size or higher. At lower concentrations of the catalytic material, there is less sensitivity to concentration, and carbon nanotubes in the range of about 1 nm to about 30 nm in size or even up to about 50 nm in size can be produced.

In some embodiments, an average length of the carbon nanotubes grown on the glass substrate can be between about 1 µm and about 1000 µm, including all values and subranges therebetween. In some embodiments, an average length of the carbon nanotubes can be less than about 1 µm, including about 0.5 µm, for example, and all values and subranges therebetween. In some embodiments, an average length of the carbon nanotubes can be between about 1 µm and about 10 µm, including, all values and subranges therebetween. Generally, higher loadings of catalytic material in the present embodiments can favor greater carbon nanotube growth rates and longer carbon nanotubes.

In some embodiments, the catalytic material of the present processes can be a catalyst and/or a catalyst precursor. That is, the catalytic material can be an active catalyst that can directly catalyze the formation of carbon nanotubes in some embodiments. For example, the catalytic material can be catalytic nanoparticles (e.g., transition metal nanoparticles or lanthanide metal nanoparticles) that can directly catalyze the formation of carbon nanotubes without further transformation or activation being needed. In other embodiments, the catalytic material can be a catalyst precursor that is initially catalytically inactive but can be converted through one or more chemical transformations into an active catalyst. Such conversion to an active catalyst can occur prior to and/or during exposure of the glass substrate to carbon nanotube growth conditions. According to the present embodiments, a catalyst precursor can be converted into an active catalyst without exposure to a discrete reduction step (e.g., $H_2$) prior to being exposed to suitable carbon nanotube growth conditions.

In some embodiments, the catalytic material can be in the form of catalytic nanoparticles. In other embodiments, the catalytic material can be in the form of a catalyst precursor. It has been found that in the present embodiments, a catalyst precursor can demonstrate superior carbon nanotube growth rates over pre-formed catalytic nanoparticles. In some embodiments, the catalyst precursor can be a transition metal salt or a combination of transition metal salts. Illustrative transition metal salts can include, for example, a transition metal nitrate, a transition metal acetate, a transition metal citrate, a transition metal chloride, a transition metal fluoride, a transition metal bromide, a transition metal iodide, hydrates thereof, and combinations thereof. Such transition metal salts can be transformed into a transition metal oxide upon heating, with conversion to an active catalyst occurring as described in further detail hereinafter. In alternative embodiments, transition metal carbides, transition metal nitrides, or transition metal oxides can be used as the catalytic material. Illustrative transition metal salts suitable for practicing the present processes include, for example, iron (II) nitrate, iron (III) nitrate, cobalt (II) nitrate, nickel (II) nitrate, copper (II) nitrate, iron (II) acetate, iron (III) acetate, cobalt (II) acetate, nickel (II) acetate, copper (II) acetate, iron (II) citrate, iron (III) citrate, iron (III) ammonium citrate, cobalt (II) citrate, nickel (II) citrate, copper (II) citrate, iron (II) chloride, iron (III) chloride, cobalt (II) chloride, nickel (II) chloride, copper (II) chloride, hydrates thereof, and combinations thereof. In alternative embodiments, lanthanide metal salts, their hydrates, and combinations thereof can be used as a catalyst precursor.

In more particular embodiments, the catalyst precursor can be a combination of an iron (II) salt or a hydrate thereof and a cobalt (II) salt or a hydrate thereof. In some embodiments, the catalyst precursor can be formed from a reaction between at least one transition metal salt and hydrogen peroxide or other oxidant. In some embodiments, the reaction can take place in a solution from which the catalytic material is deposited.

In the case of a catalyst precursor containing an iron (II) salt or a hydrate thereof (particularly iron (II) acetate or a hydrate thereof) and a cobalt (II) salt or a hydrate thereof (particularly cobalt (II) acetate or a hydrate thereof), hydrogen peroxide can be used to form a catalyst precursor that ultimately leads to a more active catalyst (e.g., an iron-cobalt alloy). It has been surprisingly discovered that a catalyst precursor formed from a reaction between hydrogen peroxide, iron (II) acetate or a hydrate thereof, and cobalt (II) acetate or a hydrate thereof can be converted into an active catalyst that is particularly efficacious for growing carbon nanotubes on glass substrates. Further, the addition of hydrogen peroxide to a solution containing the above-described catalyst precursor can advantageously increase solubility of the transition metal salts.

Without being bound by theory or mechanism, it is believed that the formation of a catalyst precursor from a reaction between hydrogen peroxide, iron (II) acetate, and cobalt (II) acetate begins with a transformation of iron (II) in reactions based on the chemistry of Fenton's reagent (Formulas 1 and 2).

Figure 1A:
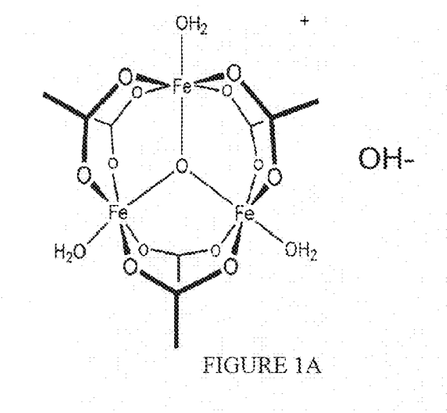
FIGS. 1A and 1B show presumed structures of basic iron (III) acetate and a mixed iron (III)/cobalt (II) compound.
Figure 1B:
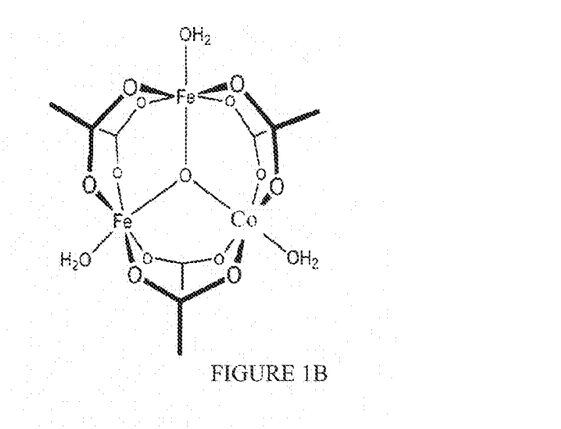

In the case of iron (II) acetate, the initial oxidation product is basic iron (III) acetate, which subsequently forms a mixed valence iron (II)/iron (III) compound that is presumed to have a comparable structure. In the presence of cobalt (II) acetate, a mixed metal iron (III)/cobalt (II) compound also having a comparable structure is presumed to form. FIGS. 1A and 1B respectively show presumed structures of basic iron (III) acetate and a mixed iron (III)/cobalt (II) compound prepared as described above. The formation of the mixed metal compound is summarized in Formulas (3)-(5) (OAc=acetate=$C_2H_3O_2^-$).

In addition to the mixed metal compound, the reaction mixture can also contain residual basic iron (III) acetate and unreacted cobalt (II) acetate. In addition to the mixed metal compound, each of these substances can also be converted into an active catalyst according to the embodiments described hereinafter.

After deposition of the above catalyst precursor on the glass substrate, heating can take place to form an intermediate catalyst state. That is, the mixed metal compound, basic iron (III) acetate, and cobalt (II) acetate can be thermally decomposed to form metal oxides on the glass substrate. Other catalyst precursors described above can be thermally decomposed in a like manner to form the intermediate catalyst state. In some embodiments, the heating can take place at a temperature of at least about 300° C. In other embodiments, the heating can take place at a temperature of at least about 450° C. In the present case, it is believed that basic iron (III) acetate is thermally decomposed to metastable γ-iron (III) oxide (maghemite) and stable α-iron (III) oxide (hematite), cobalt (II) acetate is thermally decomposed to cobaltous oxide (CoO), and the mixed metal compound is thermally decomposed to cobalt ferrite ($CoFe_2O_4$). Various gaseous byproducts can also be produced. Chemical identity of the thermal decomposition products can be determined through a combination of high-resolution transition electron microscopy, electron diffraction spectroscopy (d-spacing of crystalline structures), and energy-dispersive X-ray spectroscopy (elemental composition). In the present case, d-spacings and elemental composition results were highly consistent with the assigned chemical identities.

Once formed, the intermediate catalyst state can be directly converted into an active catalyst (e.g., catalytic nanoparticles) without a separate catalyst activation step being conducted. In contrast, it is conventional in the art to activate carbon nanotube catalysts with hydrogen in a separate step before proceeding with carbon nanotube growth. In the present embodiments, formation of the active catalyst can take place upon exposure of the intermediate catalyst state to carbon nanotube growth conditions. For example, pyrolysis of acetylene at 700° C. in a carbon nanotube growth reactor results in the formation of hydrogen gas and atomic carbon. The hydrogen gas can react with a transition metal oxide to produce zerovalent transition metal catalytic nanoparticles. Formation of a transition metal carbide thereafter and ensuing diffusion of carbon into the catalyst particles can result in formation of carbon nanotubes.

Returning to the active catalyst produced from the mixed metal compound described above, high-resolution transition electron microscopy, electron diffraction spectroscopy, and energy-dispersive X-ray spectroscopy were again used to determine the identity of the active catalyst particles produced upon exposure to carbon nanotube growth conditions. In the case of an initial iron (II) acetate/cobalt (II) acetate solution containing approximately a 5.6:1 molar ratio of iron (II) to cobalt (II), the following substances were identified: Fe (55.1%-83.3%), Co (0%-6.7%), and Fe/Co alloy (0%-19.2%). Additionally, residual iron oxides, cobalt oxide, and cobalt ferrite were seen following exposure to carbon nanotube growth conditions.

Figure 2:
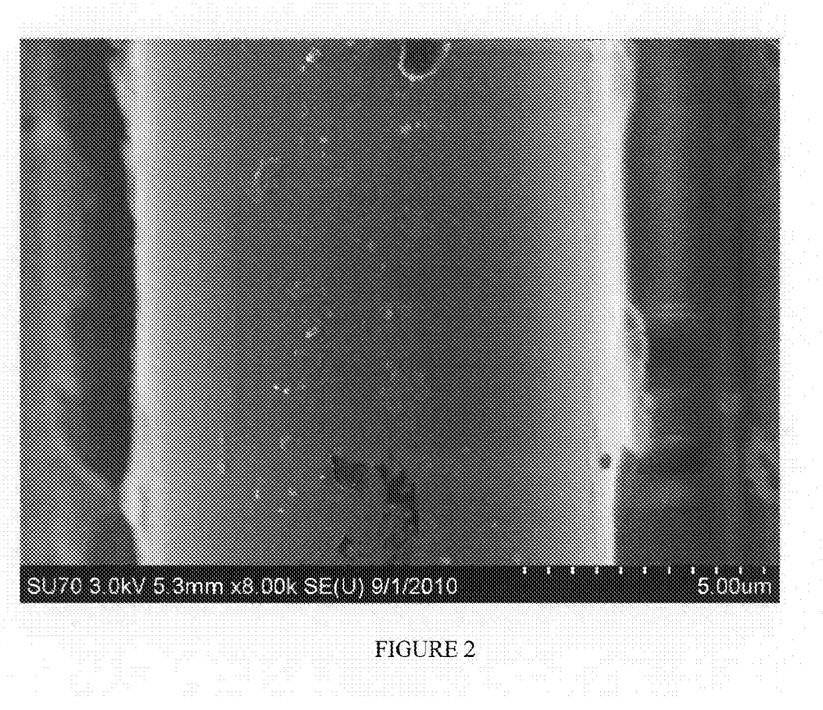
FIG. 2 shows an illustrative SEM image of a carbon nanotube catalyst precursor on a glass fiber substrate at 8 k magnification.
Figure 3:
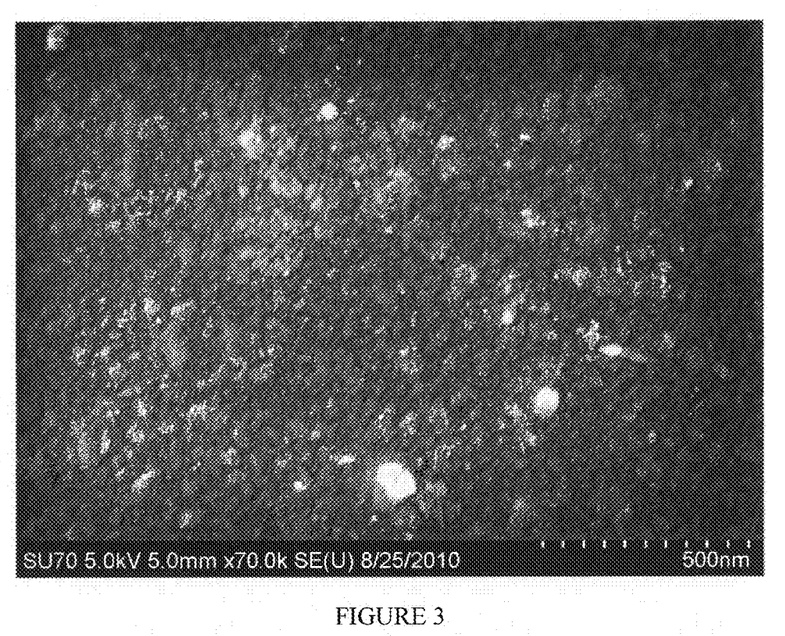
FIG. 3 shows an illustrative SEM image of a carbon nanotube catalyst precursor on a glass fiber substrate at 70 k magnification.
Figure 4:
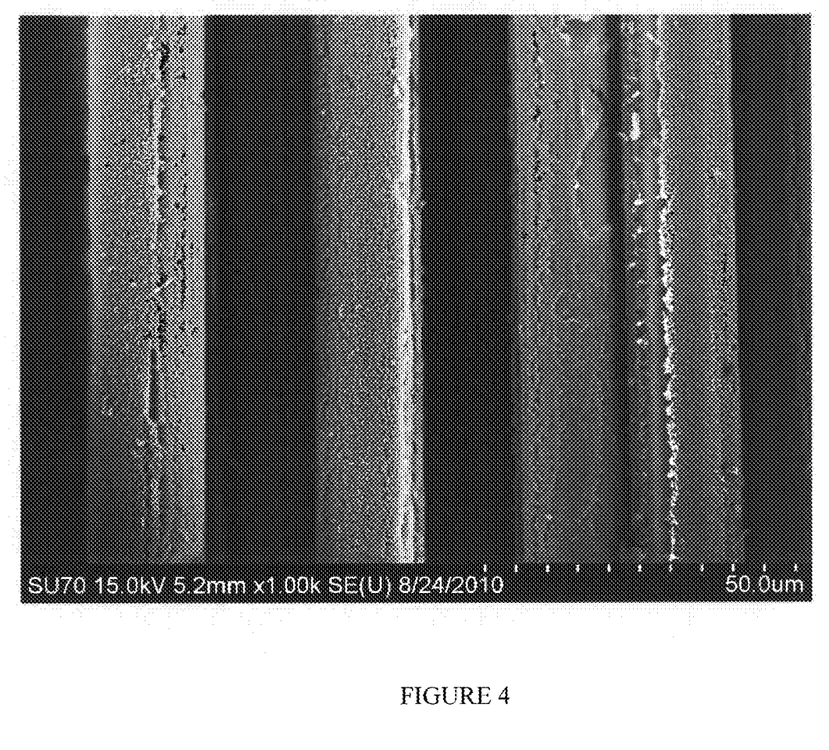
FIG. 4 shows an illustrative SEM image of carbon nanotubes grown on a glass fiber substrate from an iron-cobalt alloy catalyst (1 k magnification)
Figure 5:
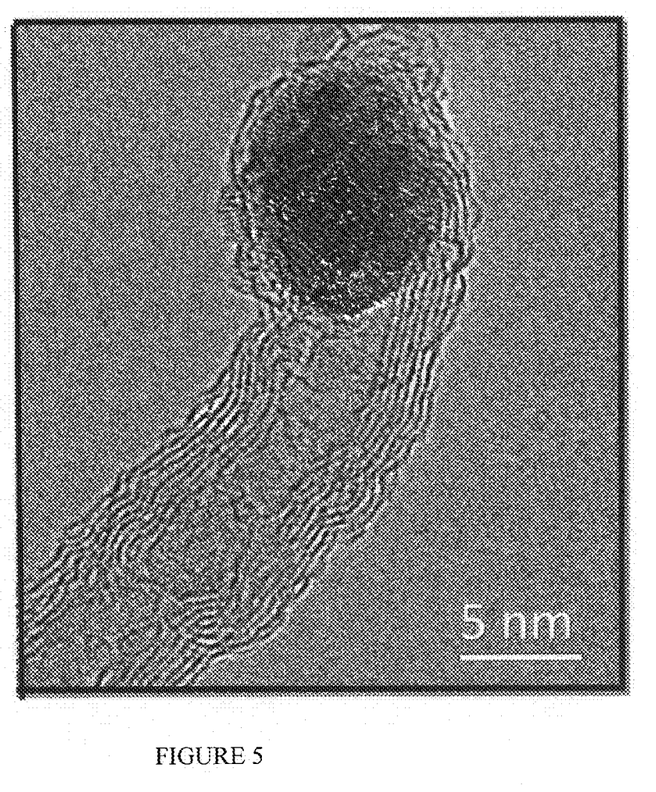
FIG. 5 shows an illustrative SEM image of a multi-wall carbon nanotube grown from a catalyst particle.

FIGS. 2-4 show illustrative SEM images of a catalyst or catalyst precursor formed from a solution containing iron (II) acetate, cobalt (II) acetate and hydrogen peroxide. FIG. 2 shows an illustrative SEM image of a carbon nanotube catalyst precursor on a glass fiber substrate at 8 k magnification. FIG. 3 shows an illustrative SEM image of a carbon nanotube catalyst precursor on a glass fiber substrate at 70 k magnification. FIG. 4 shows an illustrative SEM image of carbon nanotubes grown on a glass fiber substrate from an iron-cobalt alloy catalyst at 1 k magnification. FIG. 5 shows an illustrative SEM image of a multi-wall carbon nanotube grown from a catalyst particle.

Figure 6:
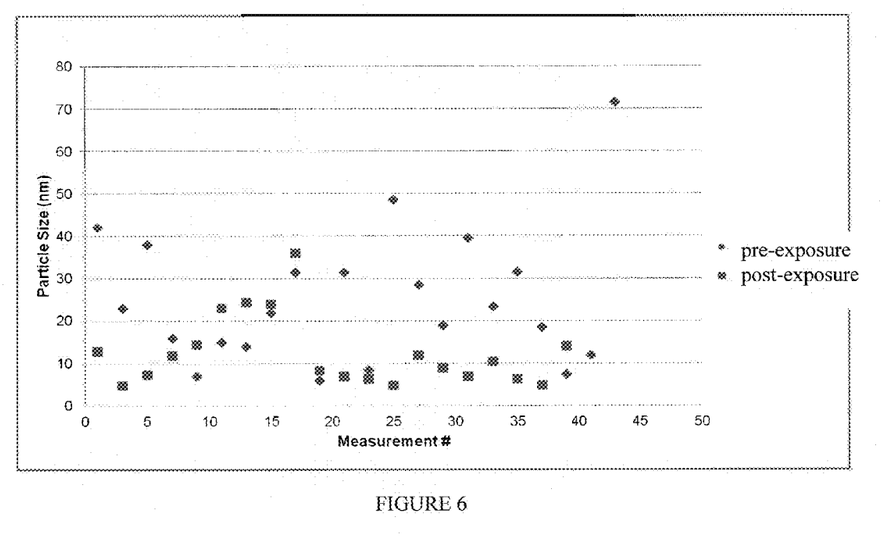
FIG. 6 shows an illustrative plot of catalyst particle size, both before and after exposure to carbon nanotube growth conditions.

FIG. 6 shows an illustrative plot of catalyst particle size, both before and after exposure to carbon nanotube growth conditions. Prior to exposure to carbon nanotube growth conditions, the average particle size was about 25 nm (25.2 nm±16.0 nm), and after exposure to carbon nanotube growth conditions, the average particle size was about 12-13 nm (12.5±8.3 nm). In general, the particle size ranged between about 5 nm and about 50 nm.

In some embodiments, a non-catalytic material can also be used in the present processes in conjunction with the catalytic material. Although carbon nanotubes can be grown on glass substrates without a non-catalytic material, use of a non-catalytic material in conjunction with the catalytic material can in many cases result in improved carbon nanotube growth rates. Without being bound by theory or mechanism, it is believed that the non-catalytic material limits interactions of the catalytic material with the glass substrate that can otherwise inhibit carbon nanotube growth. Further, it is also believed that the non-catalytic material can facilitate the dissociation of a catalyst precursor into an active catalyst. The non-catalytic material can also act as a binder to the glass substrate, thereby facilitating enhanced anchoring of the catalytic material and subsequently grown carbon nanotubes to the glass substrate. In addition, the non-catalytic material can act as a thermal barrier to protect the surface of the glass substrate and shield it from damage during carbon nanotube growth.

The use of a non-catalytic material in conjunction with a catalyst precursor can further enable the growth of carbon nanotubes on glass substrate without a separate reduction operation being needed to convert the catalyst precursor into an active catalyst suitable for carbon nanotube growth. That is, a catalyst precursor can be used in conjunction with a non-catalytic material in the present embodiments to directly grow carbon nanotubes on a glass substrate upon exposure to carbon nanotube growth conditions. In some embodiments, formation of the active catalyst from a catalyst precursor can involve the formation of an intermediate catalyst state (e.g., a transition metal oxide). In some embodiments, the present processes include forming catalytic nanoparticles from a catalyst precursor or an intermediate catalyst state while the glass substrate is being exposed to carbon nanotube growth conditions, optionally while the glass substrate is being transported. In alternative embodiments, the present processes include forming catalytic nanoparticles from a catalyst precursor or an intermediate catalyst state prior to exposing the glass substrate to carbon nanotube growth conditions. For example, a separate catalyst activation operation can be conducted, such as exposing the catalyst precursor or intermediate catalyst state to hydrogen. In some embodiments, the catalyst precursor or intermediate catalyst state can be deposited or formed on the glass substrate, and the glass substrate can then be stored for later use. That is, the glass substrate can be loaded with catalyst precursor or intermediate catalyst state and then exposed to carbon nanotube growth conditions at a later time.

Non-catalytic materials that are suitable for practicing the present processes are generally substances that are inert to carbon nanotube growth conditions. As described above, such non-catalytic materials can be further operable to stabilize the catalytic material, thereby facilitating carbon nanotube growth. In some embodiments, the non-catalytic material can be an aluminum-containing compound, a silicon-containing compound, or combinations thereof. Illustrative aluminum-containing compounds include, for example, aluminum salts (e.g., aluminum nitrate and aluminum acetate) or hydrates thereof. Illustrative silicon-containing compounds include glasses and like silicon dioxide formulations, silicates and silanes. In some embodiments, an alkoxysilane, an alumoxane, alumina nanoparticles, spin on glass, or glass nanoparticles can be used as the non-catalytic material.

When a non-catalytic material is used in the present processes, the catalytic material can be deposited prior to, after, or concurrently with the catalytic material. In some embodiments, the catalytic material can be deposited prior to the non-catalytic material. That is, in such embodiments, the catalytic material is deposited between the glass substrate and the non-catalytic material. In other embodiments, the catalytic material can be deposited after the non-catalytic material. That is, in such embodiments, the non-catalytic material is deposited between the glass substrate and the catalytic material. In still other embodiments, the catalytic material can be deposited concurrently with the non-catalytic material. Regardless of the deposition sequence, the combination of the catalytic material and the non-catalytic material form a catalyst coating on the glass substrate. In some embodiments, the catalyst coating has a thickness ranging between about 5 nm and about 1 μm. In other embodiments, the catalyst coating has a thickness ranging between about 5 nm and about 100 nm or between about 10 nm and about 50 nm.

In some embodiments, the catalytic material and the non-catalytic material can each be deposited from a solution. In some embodiments, the solution can contain water as a solvent. In such embodiments, the catalytic material and the non-catalytic material concentrations can generally range between about 0.1 mM and about 1.0 M. In other embodiments, the catalytic material and the non-catalytic material can each have a concentration ranging between about 0.1 mM and about 50 mM, or between about 10 mM and about 100 mM, or between about 50 mM and about 1.0 M, or between about 1.0 M and about 2.0 M. The catalytic material and the non-catalytic material can be present in the same solution or in separate solutions when deposited. When the catalytic material and the non-catalytic material are in the same solution, the referenced concentration ranges refer to the concentration of each component in the solution, rather than the overall solution concentration. In some embodiments, the catalytic material and the non-catalytic material can be deposited from a single solution onto a glass fiber as it is being formed. That is, a catalyst-loaded fiber that is suitable for being exposed to carbon nanotube growth conditions can be produced in a single operation.

The solvent(s) used in the solution(s) can generally vary without limitation, provided that they effectively solubilize or disperse the catalytic material and the non-catalytic material, if present. In addition to water, particularly suitable solvents include, for example, alcohols (e.g., methanol, ethanol, or isopropanol), esters (e.g., methyl acetate or ethyl acetate), ketones (e.g., acetone or butanone), and mixtures thereof. In some embodiments, a small amount of a co-solvent can be added to achieve solubility of a transition metal salt in a solvent in which the salt is otherwise not sufficiently soluble. Illustrative examples of such co-solvents can include, for example, glyme, diglyme, triglyme, tetraglyme, dimethylformamide, and dimethylsulfoxide. Generally, solvents having a relatively low boiling point are preferred such that the solvent can be easily removed prior to exposure to the carbon nanotube growth conditions. Ready removal of the solvent can facilitate the formation of a homogenous coating of the catalytic material. In higher boiling point solvents or those that tend to pond on the surface of the glass substrate, a non-uniform distribution of the catalytic material can occur, thereby leading to poor carbon nanotube growth.

Although inclusion of a non-catalytic material can be advantageous in the present processes, there can be an upper limit in the amount of non-catalytic material above which carbon nanotube growth becomes inhibited. This can be particularly true when the non-catalytic material is deposited after or concurrently with the catalytic material. Such a limit does not necessarily apply when the non-catalytic material is deposited prior to the catalytic material. If too much non-catalytic material is included, the non-catalytic material can excessively overcoat the catalytic material, thereby inhibiting diffusion of a carbon feedstock gas into the catalytic material and blocking carbon nanotube growth. In some embodiments, a molar ratio of the non-catalytic material to the catalytic material can be at most about 6:1. In other embodiments, a molar ratio of the non-catalytic material to the catalytic material can be at most about 2:1.

In some embodiments, the catalytic material and the non-catalytic material can be deposited by a technique or combination of techniques such as, for example, spray coating, dip coating, application of a solution-coated roller or a like solution-based deposition technique. In some embodiments, the catalytic material can be deposited from a first solution, and the non-catalytic material can be deposited from a second solution. In such embodiments, the catalytic material can be deposited prior to or after the non-catalytic material. In other embodiments, the catalytic material and the non-catalytic material can be deposited concurrently from the same solution. As will be evident to one of ordinary skill in the art, various deposition techniques can result in variable amounts of catalytic material and/or non-catalytic material being deposited on the glass substrate. When water is used a solvent or co-solvent in a solution-based deposition technique, different moisture contents can be imparted to a glass substrate.

In some embodiments, a moisture content of the glass substrates can be dependent upon the technique used for depositing the catalytic material and/or non-catalytic material. When deposited by a solution-based deposition technique, factors such as, for example, residence time, operational speed, and deposition configuration (e.g., submersion versus roller coating) can influence the moisture content of the glass substrate. In some embodiments, the moisture content of the glass substrate after deposition can range between about 0.1 wt. % and about 200 wt. %. In other embodiments, the moisture content of the glass substrate can range between about 0.1 wt. % and about 10 wt. %, or between about 5 wt. % and about 20 wt. %, or between about 10 wt. % and about 50 wt. %, or between about 50 wt. % and about 100 wt. %, or between about 100 wt. % and about 200 wt. %. The variable moisture content of the glass substrate can result in a wide range of catalyst mass surface coverage values.

The amount of catalytic material and non-catalytic material deposited on the glass substrate can depend on the deposition technique and the imparted moisture content. In some embodiments, the mass surface coverage of the catalytic material and/or the non-catalytic material deposited on the glass substrate can each range between about 0.0001 g/m² and about 0.2 g/m². In other embodiments, the mass surface coverage of the catalytic material and/or the non-catalytic material can each range between about 0.0001 g/m² and about 0.002 g/m², or between about 0.002 g/m² and about 0.005 g/m², or between about 0.005 g/m² and about 0.02 g/m², or between about 0.01 g/m² and about 0.05 g/m², or between about 0.05 g/m² and about 0.2 g/m².

In some embodiments, the carbon nanotube growth processes include depositing a catalyst precursor on a glass fiber substrate, depositing a non-catalytic material on the glass fiber substrate, converting the catalyst precursor into a catalyst that is operable for forming carbon nanotubes when exposed to carbon nanotube growth conditions, and exposing the glass fiber substrate to carbon nanotube growth conditions while the glass fiber substrate is being transported so as to grow carbon nanotubes thereon.

In some embodiments, the carbon nanotube growth processes include allowing a solution containing water, hydrogen peroxide, an iron (II) salt or a hydrate thereof, and a cobalt (II) salt or a hydrate thereof to form a catalyst precursor in the solution; depositing the catalyst precursor on a glass fiber substrate; depositing a non-catalytic material on the glass fiber substrate; converting the catalyst precursor into a catalyst that is operable for forming carbon nanotubes upon exposure to carbon nanotube growth conditions; and exposing the glass fiber substrate to carbon nanotube growth conditions so as to grow carbon nanotubes thereon. In some embodiments, a molar ratio of iron to cobalt can range between about 5:1 to about 6:1. In some embodiments, a molar ratio of iron to cobalt can be up to about 20:1.

As described in more detail above, the catalyst formed in such embodiments can include at least an iron-cobalt alloy. As also described in more detail above, converting the catalyst precursor into a catalyst can involve heating the catalyst precursor to form an intermediate catalyst state and exposing the intermediate catalyst state to carbon nanotube growth conditions to form the catalyst.

After deposition of the catalytic material, a chemical vapor deposition (CVD)-based process or other process for growing carbon nanotubes can be used to grow carbon nanotubes on the glass substrate. Illustrative processes for carbon nanotube synthesis include, for example, micro-cavity, thermal or plasma-enhanced CVD techniques, laser ablation, arc discharge, flame synthesis and high pressure carbon monoxide (HiPC®) synthesis, all of which are known to one having ordinary skill in the art. In some embodiments, the CVD-based growth process can be plasma-enhanced. In some embodiments, the process for growing carbon nanotubes can take place continuously with the glass substrate being transported through a reactor while being exposed to carbon nanotube growth conditions.

In the embodiments described herein, carbon nanotube growth can take place in a continuous (i.e., moving) manner or under batchwise (i.e., static) conditions. In non-limiting embodiments, growth of carbon nanotubes can take place in reactors that are adapted for continuous carbon nanotube growth. Illustrative reactors having such features are described in commonly owned U.S. patent application Ser. No. 12/611,073, filed Nov. 2, 2009, and U.S. Pat. No. 7,261,779, each of which is incorporated herein by reference in its entirety. Although the above reactors are designed for continuously transporting a substrate through the reactor for exposure to carbon nanotube growth conditions, the reactors can also be operated in a batchwise mode with the substrate remaining stationary, if desired. Further details of an illustrative carbon nanotube reactor capable of having a substrate transported therethrough and certain process details for growing carbon nanotubes are set forth hereinafter. It should be noted that the processes described herein are not tied to a particular carbon nanotube growth reactor, and any suitable reactor known to one or ordinary skill in the art can be utilized in the present processes.

Carbon nanotube growth can be based on a chemical vapor deposition (CVD) process that occurs at elevated temperatures. The specific temperature is a function of catalyst choice, but can typically be in a range of about 500° C. to about 1000° C. In some embodiments, the temperature can be in a range of about 550° C. to about 800° C. In various embodiments, the temperature can influence the carbon nanotube growth rate and/or the carbon nanotube diameters obtained.

In various embodiments, carbon nanotube growth can take place by a CVD-based process, which can be plasma-enhanced. The CVD process can be promoted by a carbon-containing feedstock gas such as, for example, acetylene, ethylene, and/or methane. The carbon nanotube synthesis processes generally use an inert gas (e.g., nitrogen, argon, and/or helium) as a primary carrier gas in conjunction with the carbon-containing feedstock gas. The carbon-containing feedstock gas can typically be provided in a range from between about 0.1% to about 50% of the total mixture. A substantially inert environment for CVD growth can be prepared by removal of moisture and oxygen from the growth chamber.

A strong plasma-creating electric field can optionally be employed to affect the direction of carbon nanotube growth. A plasma can be generated by providing an electric field during the growth process. By properly adjusting the geometry of the plasma spray and electric field, vertically aligned carbon nanotubes (i.e., perpendicular to the metal surface) can be synthesized. Under certain conditions, even in the absence of a plasma, closely-spaced carbon nanotubes can maintain a substantially vertical growth direction resulting in a dense array of carbon nanotubes resembling a carpet or forest.

In some embodiments, acetylene gas can be ionized to create a jet of cold carbon plasma for carbon nanotube synthesis. The carbon plasma is directed toward the glass substrate. Thus, in some embodiments, methods for synthesizing carbon nanotubes on a glass substrate include (a) forming a carbon plasma; and (b) directing the carbon plasma onto the catalytic material disposed on the glass substrate. In some embodiments, a glass substrate can be actively heated to between about 550° C. and about 800° C. to facilitate carbon nanotube growth. To initiate the growth of carbon nanotubes, two or more gases are bled into the reactor: an inert carrier gas (e.g., argon, helium, or nitrogen) and a carbon-containing feedstock gas (e.g., acetylene, ethylene, ethanol or methane).

In some embodiments, carbon nanotube growth can take place in a special rectangular reactor designed for continuous synthesis and growth of carbon nanotubes on fiber materials. Such a reactor is described in commonly-owned, co-pending U.S. patent application Ser. No. 12/611,073, incorporated by reference hereinabove. This reactor utilizes atmospheric pressure growth of carbon nanotubes, which facilitates its incorporation in a continuous carbon nanotube growth process. In addition, the reactor can be operated in a batchwise manner with the glass substrate being held stationary, if desired. More conventional reactors for static carbon nanotube growth can also be used, if desired. In some embodiments, carbon nanotubes can be grown via a CVD process at atmospheric pressure and an elevated temperature in the range of about 550° C. and about 800° C. in a multi-zone reactor. The fact that the carbon nanotube synthesis occurs at atmospheric pressure is one factor that facilitates the incorporation of the reactor into a continuous processing line for carbon nanotube growth on the glass substrate. Another advantage consistent with in-line continuous processing using such a multi-zone reactor is that carbon nanotube growth occurs in seconds, as opposed to minutes (or longer), as in other procedures and apparatus configurations typical in the art.

Carbon nanotube synthesis reactors designed in accordance with the above embodiments can include the following features:

Rectangular Configured Synthesis Reactors: The cross-section of a typical carbon nanotube synthesis reactor known in the art is circular. There are a number of reasons for this including, for example, historical reasons (e.g., cylindrical reactors are often used in laboratories) and convenience (e.g., flow dynamics are easy to model in cylindrical reactors, heater systems readily accept circular tubes (e.g., quartz, etc.), and ease of manufacturing. Departing from the cylindrical convention, the present disclosure provides a carbon nanotube synthesis reactor having a rectangular cross section. The reasons for the departure include at least the following:

1) Inefficient Use of Reactor Volume. Since many glass substrates that are to be processed by the reactor are relatively planar (e.g., flat tapes, sheet-like forms, or spread tows or rovings), a circular cross-section is an inefficient use of the reactor volume. This inefficiency results in several drawbacks for cylindrical carbon nanotube synthesis reactors including, for example, a) maintaining a sufficient system purge; increased reactor volume requires increased gas flow rates to maintain the same level of gas purge, resulting in inefficiencies for high volume production of carbon nanotubes in an open environment; b) increased carbon-containing feedstock gas flow rates; the relative increase in inert gas flow for system purge, as per a) above, requires increased carbon-containing feedstock gas flow rates. Consider that the volume of an illustrative 12K glass fiber roving is approximately 2000 times less than the total volume of a synthesis reactor having a rectangular cross-section. In an equivalent cylindrical reactor (i.e., a cylindrical reactor that has a width that accommodates the same planarized glass fiber material as the rectangular cross-section reactor), the volume of the glass fiber material is approximately 17,500 times less than the volume of the reactor. Although gas deposition processes, such as CVD, are typically governed by pressure and temperature alone, volume can have a significant impact on the efficiency of deposition. With a rectangular reactor there is a still excess volume, and this excess volume facilitates unwanted reactions. However, a cylindrical reactor has about eight times that volume available for facilitating unwanted reactions. Due to the greater opportunity for competing reactions to occur, the desired reactions effectively occur more slowly in a cylindrical reactor. Such a slow down in carbon nanotube growth, is problematic for the development of continuous growth processes. Another benefit of a rectangular reactor configuration is that the reactor volume can be decreased further still by using a small height for the rectangular chamber to make the volume ratio better and the reactions even more efficient. In some embodiments disclosed herein, the total volume of a rectangular synthesis reactor is no more than about 3000 times greater than the total volume of a glass substrate being passed through the synthesis reactor. In some further embodiments, the total volume of the rectangular synthesis reactor is no more than about 4000 times greater than the total volume of the glass substrate being passed through the synthesis reactor. In some still further embodiments, the total volume of the rectangular synthesis reactor is less than about 10,000 times greater than the total volume of the glass substrate being passed through the synthesis reactor. Additionally, it is notable that when using a cylindrical reactor, more carbon-containing feedstock gas is required to provide the same flow percent as compared to reactors having a rectangular cross section. It should be appreciated that in some other embodiments, the synthesis reactor has a cross-section that is described by polygonal forms that are not rectangular, but are relatively similar thereto and provide a similar reduction in reactor volume relative to a reactor having a circular cross section; and c) problematic temperature distribution; when a relatively small-diameter reactor is used, the temperature gradient from the center of the chamber to the walls thereof is minimal, but with increased reactor size, such as would be used for commercial-scale production, such temperature gradients increase. Temperature gradients result in product quality variations across the glass substrate (i.e., product quality varies as a function of radial position). This problem is substantially avoided when using a reactor having a rectangular cross-section. In particular, when a planar substrate is used, reactor height can be maintained constant as the size of the substrate scales upward. Temperature gradients between the top and bottom of the reactor are essentially negligible and, as a consequence, thermal issues and the product-quality variations that result are avoided.

2) Gas introduction. Because tubular furnaces are normally employed in the art, typical carbon nanotube synthesis reactors introduce gas at one end and draw it through the reactor to the other end. In some embodiments disclosed herein, gas can be introduced at the center of the reactor or within a target growth zone, symmetrically, either through the sides or through the top and bottom plates of the reactor. This improves the overall carbon nanotube growth rate because the incoming feedstock gas is continuously replenishing at the hottest portion of the system, which is where carbon nanotube growth is most active.

Zoning. Chambers that provide a relatively cool purge zone extend from both ends of the rectangular synthesis reactor. It has been determined that if a hot gas were to mix with the external environment (i.e., outside of the rectangular reactor), there would be increased degradation of the glass substrate. The cool purge zones provide a buffer between the internal system and external environments. Carbon nanotube synthesis reactor configurations known in the art typically require that the substrate is carefully (and slowly) cooled. The cool purge zone at the exit of the present rectangular carbon nanotube growth reactor achieves the cooling in a short period of time, as required for continuous in-line processing.

Non-contact, hot-walled, metallic reactor. In some embodiments, a metallic hot-walled reactor (e.g., stainless steel) is employed. Use of this type of reactor can appear counterintuitive because metal, and stainless steel in particular, is more susceptible to carbon deposition (i.e., soot and by-product formation). Thus, most carbon nanotube synthesis reactors are made from quartz because there is less carbon deposited, quartz is easier to clean, and quartz facilitates sample observation. However, it has been observed that the increased soot and carbon deposition on stainless steel results in more consistent, efficient, faster, and stable carbon nanotube growth. Without being bound by theory it has been indicated that, in conjunction with atmospheric operation, the CVD process occurring in the reactor is diffusion limited. That is, the carbon nanotube-forming catalyst is "overfed;" too much carbon is available in the reactor system due to its relatively higher partial pressure (than if the reactor was operating under partial vacuum). As a consequence, in an open system—especially a clean one—too much carbon can adhere to the particles of carbon nanotube-forming catalyst, compromising their ability to synthesize carbon nanotubes. In some embodiments, the rectangular reactor is intentionally run when the reactor is "dirty," that is with soot deposited on the metallic reactor walls. Once carbon deposits to a monolayer on the walls of the reactor, carbon will readily deposit over itself. Since some of the available carbon is "withdrawn" due to this mechanism, the remaining carbon feedstock, in the form of radicals, reacts with the carbon nanotube-forming catalyst at a rate that does not poison the catalyst. Existing systems run "cleanly" which, if they were open for continuous processing, would produce a much lower yield of carbon nanotubes at reduced growth rates.

Although it is generally beneficial to perform carbon nanotube synthesis "dirty" as described above, certain portions of the apparatus (e.g., gas manifolds and inlets) can nonetheless negatively impact the carbon nanotube growth process when soot creates blockages. In order to combat this problem, such areas of the carbon nanotube growth reaction chamber can be protected with soot inhibiting coatings such as, for example, silica, alumina, or MgO. In practice, these portions of the apparatus can be dip-coated in these soot inhibiting coatings. Metals such as INVAR (a nickel-steel alloy commercially available from ArcelorMittal) can be used with these coatings as INVAR has a similar CTE (coefficient of thermal expansion) ensuring proper adhesion of the coating at higher temperatures, preventing the soot from significantly building up in critical zones.

Combined Catalyst Reduction and Carbon Nanotube Synthesis. In the carbon nanotube synthesis reactor disclosed herein, both catalyst reduction and carbon nanotube growth can occur within the reactor. In a typical process known in the art, a reduction step typically takes 1-12 hours to perform. Both operations can occur in a reactor in accordance with the present disclosure due, at least in part, to the fact that carbon-containing feedstock gas is introduced at the center of the reactor, not the end as would be typical in the art using cylindrical reactors. The reduction process occurs as the glass substrate enters the heated zone. By this point, the gas has had time to react with the walls and cool off prior to reducing the catalyst (via hydrogen radical interactions). It is this transition region where the reduction can occur. At the hottest isothermal zone in the system, carbon nanotube growth occurs, with the greatest growth rate occurring proximal to the gas inlets near the center of the reactor.

It is understood that modifications which do not substantially affect the activity of the various embodiments of this invention are also included within the definition of the invention provided herein. Accordingly, the following Examples are intended to illustrate but not limit the present invention.

EXAMPLE 1

Formation of a Catalyst Precursor From Iron (II) Acetate and Cobalt (II) Acetate. To 3900 mL of deionized water was added 125.23 g iron (II) acetate, and mixing was conducted without heat until the solid was fully dissolved. Next, 100 mL of 30 wt. % $H_2O_2$ was added, and mixing was continued for 2 minutes without heat. Finally, 31.88 g of cobalt (II) acetate tetrahydrate was added, and mixing was continued without addition of heat until the solid was completely dissolved. The final solution concentrations were 180 mM in iron (II) and 32 mM in Co (II). After deposition on a glass substrate, transition metal oxides were formed by thermal decomposition at 550° C. in the presence of air.

The deposition process utilized in this example imparted about 35% moisture content to the glass substrate, resulting in a mass catalyst coverage of about 0.038 g/m$^2$ and a nominal particle coverage of about 6876 particles/µm$^2$ (assuming a spherical particle of 12.5 nm diameter). The stated mass surface coverage and nominal particle coverage refer to the overall coverage of iron (III) oxide, cobaltous oxide and cobalt ferrite, as opposed to the coverage of each component individually. Under carbon nanotube growth conditions, this catalyst system produced an average carbon nanotube growth rate of 3.7 µm/sec at a process line speed of 4 ft/min. The average carbon nanotube length was 110 µm.

EXAMPLE 2

Formation of a Catalyst Precursor From Iron (II) Acetate and Cobalt (II) Acetate. To 2000 mL of deionized water was added 62.61 g iron (II) acetate, and mixing was conducted without heat until the solid was fully dissolved. Next, 15.94 g of cobalt (II) acetate tetrahydrate was added, and mixing was continued without addition of heat until the solid was completely dissolved. The final solution concentrations were 180 mM in iron (II) and 32 mM in Co (II). After deposition on a glass substrate, transition metal oxides were formed by thermal decomposition at 550° C. in the presence of air.

The deposition process utilized in this example imparted about 8% moisture content to the glass substrate, resulting in a mass catalyst coverage of about 0.0086 g/m$^2$ and a nominal particle coverage of about 1555 particles/µm$^2$ (assuming a spherical particle of 12.5 nm diameter). Under carbon nanotube growth conditions, this catalyst system produced an average carbon nanotube growth rate of 2.9 µm/sec at a process line speed of 5 ft/min. The average carbon nanotube length was 70 µm.

EXAMPLE 3

Formation of a Catalyst Precursor From Iron (II) Acetate, Cobalt (II) Acetate and Aluminum Nitrate. In this example, aluminum nitrate was added as a non-catalytic material. To 4000 mL of deionized water was added 17.39 g iron (II) acetate, and mixing was conducted without heat until the solid was fully dissolved. Next, 4.98 g of cobalt (II) acetate tetrahydrate was added, and mixing was continued without addition of heat until the solid was completely dissolved. Finally, 7.50 g of aluminum nitrate nonahydrate was added, and mixing was continued without addition of heat until the solid was completely dissolved. The final solution concentrations were 25 mM in iron (II), 5 mM in Co (II) and 5 mM in Al. After deposition on a glass substrate, transition metal oxides were formed by thermal decomposition at 550° C. in the presence of air.

The deposition process utilized in this example imparted about 35% moisture content to the glass substrate, resulting in a mass catalyst coverage of about 0.0053 g/m$^2$ and a nominal particle coverage of about 958 particles/µm$^2$ (assuming a spherical particle of 12.5 nm diameter). Under carbon nanotube growth conditions, this catalyst system produced an average carbon nanotube growth rate of 3.7 µm/sec at a process line speed of 4 ft/min. The average carbon nanotube length was 110 µm.

EXAMPLE 4

Formation of a Catalyst Precursor From Iron (III) Ammonium Citrate. To 2000 mL of deionized water was added 528.5 g iron (III) ammonium citrate, and mixing was conducted without heat until the solid was fully dissolved. The final solution concentration was 875 mM in iron (III). After deposition on a glass substrate, transition metal oxides were formed by thermal decomposition at 550° C. in the presence of air.

The deposition process utilized in this example imparted about 7.2% moisture content to the glass substrate, resulting in a mass catalyst coverage of about 0.033 g/m$^2$ and a nominal particle coverage of about 6086 particles/µm$^2$ (assuming an spherical particle of 12.5 nm diameter and a molecular weight of 302 g/mol for iron (III) ammonium citrate). Under carbon nanotube growth conditions, this catalyst system produced an average carbon nanotube growth rate of 2.0 µm/sec at a process line speed of 2 ft/min. The average carbon nanotube length was 115 µm.

Although the invention has been described with reference to the disclosed embodiments, those of ordinary skill in the art will readily appreciate that these embodiments are only illustrative of the invention. It should be understood that various modifications can be made without departing from the spirit of the invention. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range is specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is:

1. A carbon nanotube growth process comprising:
   depositing a catalyst precursor on a glass substrate, the catalyst precursor being deposited from a solution comprising water as a solvent;
      wherein the catalyst precursor is formed from a reaction between at least one transition metal salt and hydrogen peroxide in the solution from which the catalyst precursor is deposited; and
   after depositing the catalyst precursor, exposing the glass substrate to carbon nanotube growth conditions so as to grow carbon nanotubes thereon;

wherein the catalyst precursor is converted into a catalyst that is operable for forming carbon nanotubes when exposed to the carbon nanotube growth conditions.

2. The carbon nanotube growth process of claim 1, further comprising:
transporting the glass substrate while the carbon nanotubes are being grown thereon.

3. The carbon nanotube growth process of claim 1, wherein the catalyst precursor comprises a transition metal salt selected from the group consisting of a transition metal nitrate, a transition metal acetate, a transition metal citrate, a transition metal chloride, hydrates thereof, and combinations thereof.

4. The carbon nanotube growth process of claim 3, wherein the transition metal salt is selected from the group consisting of iron (II) nitrate, iron (III) nitrate, cobalt (II) nitrate, nickel (II) nitrate, copper (II) nitrate, iron (II) acetate, iron (III) acetate, cobalt (II) acetate, nickel (II) acetate, copper (II) acetate, iron (II) citrate, iron (III) citrate, iron (III) ammonium citrate, cobalt (II) citrate, nickel (II) citrate, copper (II) citrate, iron (II) chloride, iron (III) chloride, cobalt (II) chloride, nickel (II) chloride, copper (II) chloride, hydrates thereof, and combinations thereof.

5. The carbon nanotube growth process of claim 1, wherein the at least one transition metal salt comprises an iron (II) salt or a hydrate thereof and a cobalt (II) salt or a hydrate thereof.

6. A carbon nanotube growth process comprising:
depositing a catalyst precursor on a glass fiber substrate, the catalyst precursor being deposited from a solution comprising water as a solvent;
wherein the catalyst precursor is formed from a reaction between at least one transition metal salt and hydrogen peroxide in the solution from which the catalyst precursor is deposited;
converting the catalyst precursor into a catalyst that is operable for forming carbon nanotubes when exposed to carbon nanotube growth conditions; and
exposing the glass fiber substrate to carbon nanotube growth conditions while the glass fiber substrate is being transported so as to grow carbon nanotubes thereon.

7. The carbon nanotube growth process of claim 6, wherein the at least one transition metal salt comprises iron (II) acetate or a hydrate thereof and cobalt (II) acetate or a hydrate thereof.

8. The carbon nanotube growth process of claim 6, wherein the catalyst precursor comprises a transition metal salt selected from the group consisting of a transition metal nitrate, a transition metal acetate, a transition metal citrate, a transition metal chloride, hydrates thereof, and combinations thereof.

9. The carbon nanotube growth process of claim 8, wherein the transition metal salt is selected from the group consisting of iron (II) nitrate, iron (III) nitrate, cobalt (II) nitrate, nickel (II) nitrate, copper (II) nitrate, iron (II) acetate, iron (III) acetate, cobalt (II) acetate, nickel (II) acetate, copper (II) acetate, iron (II) citrate, iron (III) citrate, iron (III) ammonium citrate, cobalt (II) citrate, nickel (II) citrate, copper (II) citrate, iron (II) chloride, iron (III) chloride, cobalt (II) chloride, nickel (II) chloride, copper (II) chloride, hydrates thereof, and combinations thereof.

10. A carbon nanotube growth process comprising:
allowing a solution comprising water, hydrogen peroxide, an iron (II) salt or a hydrate thereof, and a cobalt (II) salt or a hydrate thereof to form a catalyst precursor in the solution, the solution comprising water as a solvent;
depositing the solution with the catalyst precursor therein onto a glass fiber substrate;
converting the catalyst precursor into a catalyst that is operable for forming carbon nanotubes upon exposure to carbon nanotube growth conditions; and
exposing the glass fiber substrate to carbon nanotube growth conditions so as to grow carbon nanotubes thereon.

11. The carbon nanotube growth process of claim 10, further comprising:
transporting the glass fiber substrate while the carbon nanotubes are being grown thereon.

12. The carbon nanotube growth process of claim 10, wherein the iron (II) salt comprises iron (II) acetate or a hydrate thereof and the cobalt (II) salt comprises cobalt (II) acetate or a hydrate thereof.

13. The carbon nanotube growth process of claim 10, wherein the catalyst comprises at least an iron-cobalt alloy.

14. The carbon nanotube growth process of claim 10, wherein converting comprises heating the catalyst precursor to form an intermediate catalyst state and exposing the intermediate catalyst state to the carbon nanotube growth conditions to form the catalyst.

15. The carbon nanotube growth process of claim 10, wherein a molar ratio of iron to cobalt ranges from about 5:1 to about 6:1.

* * * * *